United States Patent
Morita

(10) Patent No.: US 7,375,705 B2
(45) Date of Patent: May 20, 2008

(54) REFERENCE VOLTAGE GENERATION CIRCUIT, DATA DRIVER, DISPLAY DEVICE, AND ELECTRONIC INSTRUMENT

(75) Inventor: Akira Morita, Nagano (JP)

(73) Assignee: Seiko Epson Corporation (JP)

( * ) Notice: Subject to any disclaimer, the term of this patent is extended or adjusted under 35 U.S.C. 154(b) by 624 days.

(21) Appl. No.: 11/065,773

(22) Filed: Feb. 25, 2005

(65) Prior Publication Data

US 2005/0207249 A1 Sep. 22, 2005

(30) Foreign Application Priority Data

Mar. 18, 2004 (JP) ............................ 2004-079051

(51) Int. Cl.
*G09G 3/30* (2006.01)

(52) U.S. Cl. ....................................... 345/76

(58) Field of Classification Search ................. 345/76, 345/82, 204, 690, 89; 348/254; 313/500; 315/169.3

See application file for complete search history.

(56) References Cited

U.S. PATENT DOCUMENTS

| | | | |
|---|---|---|---|
| 5,867,057 A | 2/1999 | Hsu et al. | |
| 7,034,797 B2 | 4/2006 | Maki | |
| 7,248,254 B2 * | 7/2007 | Kato | ............... 345/204 |
| 2003/0151578 A1 | 8/2003 | Morita | |
| 2003/0151616 A1 | 8/2003 | Morita | |
| 2003/0151617 A1 | 8/2003 | Morita | |

FOREIGN PATENT DOCUMENTS

| | | |
|---|---|---|
| CN | 1467693 | 1/2004 |
| CN | 1185787 | 1/2005 |
| JP | 2001-290457 | 10/2001 |
| JP | 2003-233354 | 8/2003 |
| JP | 2003-233355 | 8/2003 |
| JP | 2003-233356 | 8/2003 |

* cited by examiner

*Primary Examiner*—Richard Hjerpe
*Assistant Examiner*—Abbas Abdulselam
(74) *Attorney, Agent, or Firm*—Harness, Dickey & Pierce, P.L.C.

(57) ABSTRACT

A reference voltage generation circuit includes a gamma correction resistor circuit which outputs reference voltages generated by resistively dividing voltages of two opposite ends of a resistor circuit to resistive division nodes, and high-potential-side-voltage and low-potential side-voltage supply circuits which supply a high-potential-side voltage and a low-potential-side voltage to the two opposite ends, respectively. The high-potential-side-voltage and low-potential side-voltage supply circuits supply the high-potential-side voltage and the low-potential-side voltage to the two opposite ends, respectively, by switching the high-potential-side voltage and the low-potential-side voltage for each of color components which form one pixel, the high-potential-side voltage and the low-potential-side voltage being provided for each of the color components. The gamma correction resistor circuit supplies the reference voltages switched for each of the color components to reference voltage signal lines to be selected as inputs of driver sections which drive data lines of an electro-optical device.

19 Claims, 23 Drawing Sheets

REFERENCE VOLTAGE GENERATION CIRCUIT, DATA DRIVER, DISPLAY DEVICE, AND ELECTRONIC INSTRUMENT

Japanese Patent Application No. 2004-79051, filed on Mar. 18, 2004 is hereby incorporated by reference in its entirety.

BACKGROUND OF THE INVENTION

The present invention relates to a reference voltage generation circuit, a data driver, a display device, and an electronic instrument.

A reduction in size and an increase in definition have been demanded for a display device represented by an electro-optical device such as a liquid crystal device. A liquid crystal device realizes a reduction in power consumption and is generally provided in a portable electronic instrument.

In recent years, an electroluminescent (hereinafter abbreviated as "EL") device using an EL element has attracted attention. In particular, since an organic EL device including an EL element formed by using a thin film of an organic material is a self-emission type, a backlight becomes unnecessary, whereby a wide viewing angle is realized. Moreover, since the organic EL device has a high response speed in comparison with a liquid crystal panel, a color video display can be easily realized using a simple configuration. In the case where such a display device is provided as a display section of a portable telephone, an image display rich in color tone due to an increase in the number of grayscales is required.

A drive signal for displaying an image is generally subjected to gamma correction corresponding to display characteristics of a display device. The gamma correction is performed by using a gamma correction circuit. Taking a liquid crystal device as an example, a drive voltage corrected so as to realize an optimum pixel transmissivity can be output based on grayscale data for performing a grayscale display by using the gamma correction circuit. A data line is driven based on the drive voltage.

Grayscale characteristics (voltage-luminance characteristics) of a self-emission element such as an organic EL element differ in units of color components which form one pixel. Therefore, gamma correction must be performed in units of color components. In the case of outputting a voltage obtained by dividing a predetermined range of voltage using a resistor element as the drive voltage, gamma correction may be realized by selectively outputting the drive voltage corresponding to the grayscale data selected from among a plurality of voltages divided and corrected corresponding to the grayscale characteristics.

However, in the case where gamma correction circuits which realize such a gamma correction are provided in units of data lines of a panel including organic EL elements arranged in the shape of a matrix, the output pitch of a data line driver circuit which drives the data lines is limited. Since the interconnect pitch of the data lines must be reduced in order to increase the definition of the display image, a data line driver circuit which deals with an increase in definition cannot be provided if the gamma correction circuits are provided as described above. Moreover, since current flows through the resistor element of each gamma correction circuit, power consumption cannot be reduced (see FIGS. 1 and 6 of Japanese Patent Application Laid-open No. 2001-290457, for example).

BRIEF SUMMARY OF THE INVENTION

A first aspect of the present invention relates to a reference voltage generation circuit for generating a plurality of reference voltages including a reference voltage selected corresponding to grayscale data, the reference voltage generation circuit including:

a gamma correction resistor circuit which includes a resistor circuit and outputs the reference voltages generated by resistively dividing voltages of two opposite ends of the resistor circuit to a plurality of resistive division nodes; and first and second voltage supply circuits which supply a high-potential-side voltage and a low-potential-side voltage to the two opposite ends of the resistor circuit, respectively, wherein the first and second voltage supply circuits supply at least one of the high-potential-side voltage and the low-potential-side voltage to the two opposite ends of the resistor circuit, respectively, by switching the high-potential-side voltage and the low-potential-side voltage for each of color components which form one pixel, the high-potential-side voltage and the low-potential-side voltage being provided for each of the color components, and wherein the gamma correction resistor circuit supplies each of the reference voltages to one of a plurality of reference voltage signal lines to be selected as inputs of first and second driver sections, the reference voltages being switched for each of the color components, and the first and second driver sections respectively driving first and second data lines of an electro-optical device.

A second aspect of the present invention relates to a data driver for driving a plurality of data lines of an electro-optical device including a plurality of scan lines and the data lines based on grayscale data, the data driver including:

the above reference voltage generation circuit;

a data voltage generation circuit which outputs reference voltages among the plurality of reference voltages corresponding to first and second grayscale data as first and second data voltages;

a first driver section which drives the first data line based on the first data voltage; and a second driver section which drives the second data line based on the second data voltage.

A third aspect of the present invention relates to a data driver for driving a plurality of data lines of an electro-optical device including a plurality of scan lines and the data lines based on grayscale data, the data driver including:

the above reference voltage generation circuit;

a multiplexer circuit which multiplexes the grayscale data for each of the color components of one pixel by time division;

a data voltage generation circuit which outputs reference voltages among the plurality of reference voltages corresponding to first and second grayscale data as first and second data voltages, the first and second grayscale data being multiplexed by the multiplexer circuit;

a first driver section which drives the first data line based on the first data voltage; and a second driver section which drives the second data line based on the second data voltage.

A fourth aspect of the present invention relates to a display device including:

a plurality of scan lines;

a plurality of data lines;

a plurality of pixels specified by the scan lines and the data lines;

a scan driver which scans the scan lines; and one of the above data drivers which drive the data lines of the display device.

A fifth aspect of the present invention relates to display device including:
a plurality of scan lines;
a plurality of data lines;
a plurality of color component data lines provided for each of color components which form one pixel;
a plurality of pixels specified by the scan lines and the color component data lines;
a scan driver which scans the scan lines;
one of the above data drivers which drive the data lines of the display device; and
a plurality of demultiplexers, each of the demultiplexers being provided for one of the data lines and electrically connecting the one of the data lines with corresponding one of the color component data lines in synchronization with a time division timing of the grayscale data.

A sixth aspect of the present invention relates to an electronic instrument including one of the above display devices.

DETAILED DESCRIPTION OF THE EMBODIMENT

Figure 1:
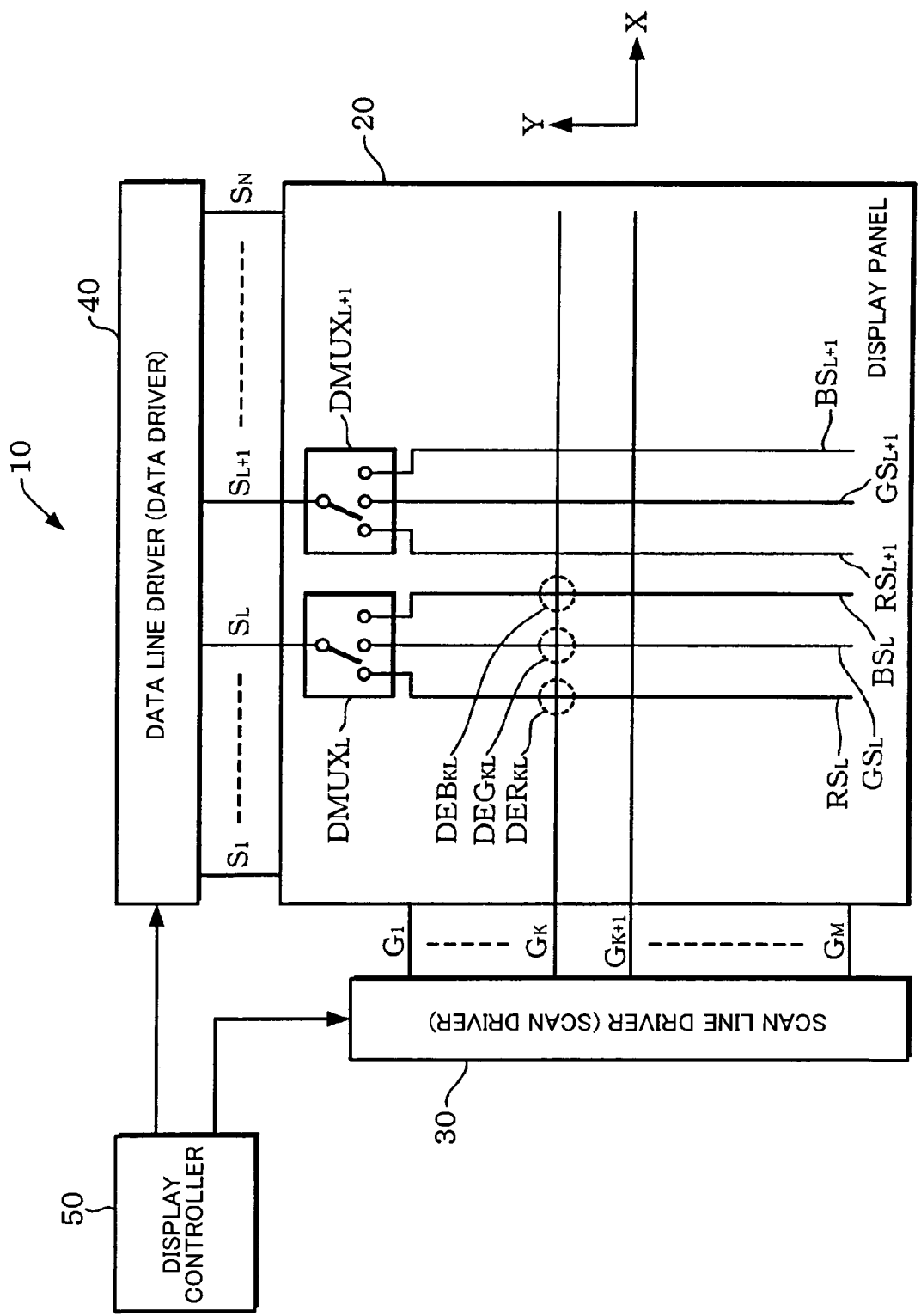
FIG. 1 is a block diagram showing a display device in an embodiment of the present invention.

An embodiment of the present invention has been achieved in view of the above-described technical problem, and may provide a reference voltage generation circuit, a data driver, a display device, and an electronic instrument for performing gamma correction while reducing power consumption without limiting the output pitch to data lines of a display panel.

An embodiment of the present invention provides a reference voltage generation circuit for generating a plurality of reference voltages including a reference voltage selected corresponding to grayscale data, the reference voltage generation circuit including:
a gamma correction resistor circuit which includes a resistor circuit and outputs the reference voltages generated by resistively dividing voltages of two opposite ends of the resistor circuit to a plurality of resistive division nodes; and
first and second voltage supply circuits which supply a high-potential-side voltage and a low-potential-side voltage to the two opposite ends of the resistor circuit, respectively,
wherein the first and second voltage supply circuits supply at least one of the high-potential-side voltage and the low-potential-side voltage to the two opposite ends of the resistor circuit, respectively, by switching the high-potential-side voltage and the low-potential-side voltage for each of color components which form one pixel, the high-potential-side voltage and the low-potential-side voltage being provided for each of the color components, and
wherein the gamma correction resistor circuit supplies each of the reference voltages to one of a plurality of reference voltage signal lines to be selected as inputs of first and second driver sections, the reference voltages being switched for each of the color components, and the first and second driver sections respectively driving first and second data lines of an electro-optical device.

In this embodiment, the high-potential-side voltage and the low-potential-side voltage supplied to either end of the resistor circuit of the gamma correction resistor circuit are changed in units of color components. Therefore, the reference voltages output from the gamma correction resistor circuit are changed in units of color components. This enables appropriate gamma correction to be performed in units of color components even if the grayscale characteristics differ in units of color components.

In this embodiment, since the gamma correction resistor circuit supplies the reference voltages to the reference voltage signal lines used in common for the first and second driver sections which respectively drive the first and second data lines of the electro-optical device, it is unnecessary to provide the reference voltage generation circuits in data line units, whereby the data line output pitch of a data driver including the reference voltage generation circuit is prevented from being limited. This makes it possible to contribute to providing a data driver which deals with an increase in definition.

In this embodiment, since one reference voltage generation circuit can be used to drive a plurality of data lines, the amount of current flowing through the resistor circuit for gamma correction can be significantly reduced in comparison with the case of providing the reference voltage generation circuits in data line units.

With this reference voltage generation circuit, the gamma correction resistor circuit may include a correction switch circuit inserted between two of the resistance division nodes, and the correction switch circuit may include a resistor element and a switch element, and may electrically connect or disconnect the two resistance division nodes into which the correction switch circuit is inserted, the resistor element and the switch element being connected in series.

With this reference voltage generation circuit, the gamma correction resistor circuit may cause at least one of the reference voltages to differ for each of the color components.

According to this embodiment, since the resistance between the resistive division nodes between which the correction switch circuit is inserted can be finely adjusted, the reference voltages can be finely adjusted in units of color components corresponding to display characteristics and manufacturing variation of the electro-optical device and visual characteristics of the human eye. Therefore, a reference voltage generation circuit which realizes excellent display characteristics while reducing power consumption can be provided.

With this reference voltage generation circuit, the color components which form one pixel may include an R component, a G component, and a B component, and a difference between the high-potential-side voltage and the low-potential-side voltage for the R component may be greater than a difference between the high-potential-side voltage and the low-potential-side voltage for the G component, and the difference between the high-potential-side voltage and the low-potential-side voltage for the G component may be greater than a difference between the high-potential-side voltage and the low-potential-side voltage for the B component.

According to this embodiment, a reference voltage generation circuit for realizing gamma correction suitable for an electro-optical device having grayscale characteristics in which the B component has the highest emission start voltage and steeply rises in luminance corresponding to the applied voltage and the R component has a wider voltage range up to the point where a predetermined luminance is reached than the G component can be provided.

With this reference voltage generation circuit, the color components which form one pixel may include an R component, a G component, and a B component, and the high-potential-side voltage for the B component may be the lowest among the high-potential-side voltage for the R component, the high-potential-side voltage for the G component, and the high-potential-side voltage for the B component.

According to this embodiment, a reference voltage generation circuit for realizing gamma correction suitable for an electro-optical device having grayscale characteristics in which the B component has the highest emission start voltage and steeply rises in luminance corresponding to the applied voltage can be provided.

With this reference voltage generation circuit, the first voltage supply circuit may include a voltage-follower-connected operational amplifier, and an output of the operational amplifier may be driven by a p-channel driver transistor.

In this embodiment, it is necessary to increase the potential of one end of the resistor circuit toward the high potential side instead of decreasing the potential of the output of the first voltage supply circuit. Therefore, the number of unnecessary current paths can be reduced in comparison with the case of using a class-AB operational amplifier circuit having a configuration which decreases the potential of the output of the first voltage supply circuit, whereby power consumption can be reduced.

With this reference voltage generation circuit, the second voltage supply circuit may include a voltage-follower-connected operational amplifier, and an output of the operational amplifier may be driven by a n-channel driver transistor.

In this embodiment, it is necessary to decrease the potential of the other end of the resistor circuit toward the low potential side instead of increasing the potential of the output of the second voltage supply circuit. Therefore, the number of unnecessary current paths can be reduced in comparison with the case of using a class-AB operational amplifier circuit having a configuration which increases the potential of the output of the second voltage supply circuit, whereby power consumption can be reduced.

With this reference voltage generation circuit, the grayscale data may be multiplexed by time division for each of the color components which form one pixel, and the first and second voltage supply circuits may supply at least one of the high-potential-side voltage and the low-potential-side voltage to the two opposite ends of the resistor circuit, respectively, by switching the high-potential-side voltage and the low-potential-side voltage for each of the color components at a time division timing of each of the color components of the grayscale data.

According to this embodiment, since it is unnecessary to provide circuits for selecting the reference voltage corresponding to the grayscale data from among the reference voltages in units of color components, the configuration of a data driver including the reference voltage generation circuit can be simplified.

An embodiment of the present invention provides a data driver for driving a plurality of data lines of an electro-optical device including a plurality of scan lines and the data lines based on grayscale data, the data driver including:

the above reference voltage generation circuit;

a data voltage generation circuit which outputs reference voltages among the plurality of reference voltages corresponding to first and second grayscale data as first and second data voltages;

a first driver section which drives the first data line based on the first data voltage; and a second driver section which drives the second data line based on the second data voltage.

An embodiment of the present invention provides a data driver for driving a plurality of data lines of an electro-optical device including a plurality of scan lines and the data lines based on grayscale data, the data driver including:

the above reference voltage generation circuit;

a multiplexer circuit which multiplexes the grayscale data for each of the color components of one pixel by time division;

a data voltage generation circuit which outputs reference voltages among the plurality of reference voltages corresponding to first and second grayscale data as first and second data voltages, the first and second grayscale data being multiplexed by the multiplexer circuit;

a first driver section which drives the first data line based on the first data voltage; and a second driver section which drives the second data line based on the second data voltage.

According to this embodiment, a data driver which performs gamma correction while reducing power consumption without limiting the output pitch to the data lines of the electro-optical device can be provided. Moreover, a data driver which drives the data lines of the electro-optical device by performing appropriate gamma correction in units of color components, even if the grayscale characteristics differ in units of color components, can be provided.

An embodiment of the present invention provides a display device including:

a plurality of scan lines;

a plurality of data lines;

a plurality of pixels specified by the scan lines and the data lines;

a scan driver which scans the scan lines; and one of the above data drivers which drive the data lines of the display device.

An embodiment of the present invention provides a display device including:

a plurality of scan lines;

a plurality of data lines;

a plurality of color component data lines provided for each of color components which form one pixel;

a plurality of pixels specified by the scan lines and the color component data lines;

a scan driver which scans the scan lines;

one of the above data drivers which drive the data lines of the display device; and a plurality of demultiplexers, each of the demultiplexers being provided for one of the data lines and electrically connecting the one of the data lines with corresponding one of the color component data lines in synchronization with a time division timing of the grayscale data.

With any of these display devices, each of the pixels may include an electroluminescent element.

According to this embodiment, a display device which realizes an increase in definition by reducing the interconnect pitch of the data lines and enables appropriate gamma correction in units of color components while reducing power consumption can be provided.

An embodiment of the present invention provides an electronic instrument including one of the above display devices.

According to this embodiment, an electronic instrument including a display device which displays a high-definition image by performing appropriate gamma correction in units of color component while reducing power consumption can be provided.

The embodiments of the present invention are described below in detail with reference to the drawings. Note that the embodiments described hereunder do not in any way limit the scope of the invention defined by the claims laid out herein. Note also that not all of the elements of these embodiments should be taken as essential requirements to the means of the present invention.

1. Display Device

FIG. 1 is a block diagram showing a display device in an embodiment of the present invention.

A display device 10 in this embodiment includes a display panel 20, a scan line driver circuit (scan driver) 30, a data line driver circuit (data driver) 40, and a display controller 50. The display device 10 does not necessarily include all of these circuit blocks. The display device 10 may have a configuration in which some of the circuit blocks are omitted.

The following description is given on the assumption that the display panel 20 is an organic EL panel. However, the present invention is not limited thereto.

The display panel (electro-optical device in a broad sense) 20 includes a plurality of scan lines (gate lines in a narrow sense), a plurality of data lines (source lines in a narrow sense), and pixels specified by the scan lines and the data lines.

The display panel 20 is formed by using a low-temperature poly-silicon (hereinafter abbreviated as "LTPS") process. According to the LTPS process, a switch circuit, a driver circuit, and the like can be directly formed on a panel substrate (glass substrate, for example) on which a pixel including a switch element (thin film transistor (TFT), for example) and the like is formed. Therefore, since the number of parts can be reduced, the size and weight of the display panel can be reduced. Moreover, LTPS enables the pixel size to be reduced while maintaining the aperture ratio by applying a conventional silicon process technology. Furthermore, since LTPS has a high charge mobility and a small parasitic capacitance in comparison with amorphous silicon (a-Si), a display drive which cannot be realized by a display panel formed by using a conventional silicon process can be achieved.

The display panel 20 includes demultiplexers formed on a panel substrate in data lines units. The demultiplexer distributes drive signals output from the data line driver circuit 40 by time division in units of color components to color component data lines provided in units of color components. This prevents the output pitch of the data line driver circuit 40 from being reduced to a large extent. In this case, the display panel 20 includes a plurality of scan lines, a plurality of data lines, a plurality of color component data lines, a plurality of pixels (display elements), and a plurality of demultiplexers. The color component data lines are provided in units of color components which form one pixel. A pixel is specified by one of the scan lines and one of the color component data lines. The demultiplexers are provided in data line units. The demultiplexer electrically connects the data line with one of the color component data lines in the number of color components corresponding to that data line in synchronization with a time division timing of grayscale data.

The display panel 20 is formed on an active matrix substrate (glass substrate, for example). A plurality of scan lines $G_1$ to $G_M$ (M is a natural number of two or more), arranged in a direction Y shown in FIG. 1 and extending in a direction X, and a plurality of data lines $S_1$ to $S_N$ (N is a natural number of two or more), arranged in the direction X and extending in the direction Y, are disposed on the active matrix substrate. The display panel 20 includes demultiplexers $DMUX_1$ to $DMUX_N$, one of the data lines being connected with an input of each of the demultiplexers. An output of each of the demultiplexers is connected with an R component data line, a G component data line, and a B component data line provided in units of color components which form one pixel. Therefore, R component data lines $RS_1$ to $RS_N$, G component data lines $GS_1$ to $GS_N$, and B component data lines $BS_1$ to $BS_N$, arranged in the direction X and extending in the direction Y, are disposed on the display panel 20.

Pixels (display elements) $DER_{KL}$, $DEG_{KL}$, and $DEB_{KL}$ are respectively provided at positions corresponding to the intersecting points of the scan line $G_K$ ($1 \leq K \leq M$, K is a natural number) and the R component data line $RS_L$ (1≦L≦N, L is a natural number), the G component data line $GS_L$, and the B component data line $BS_L$.

Figure 2:
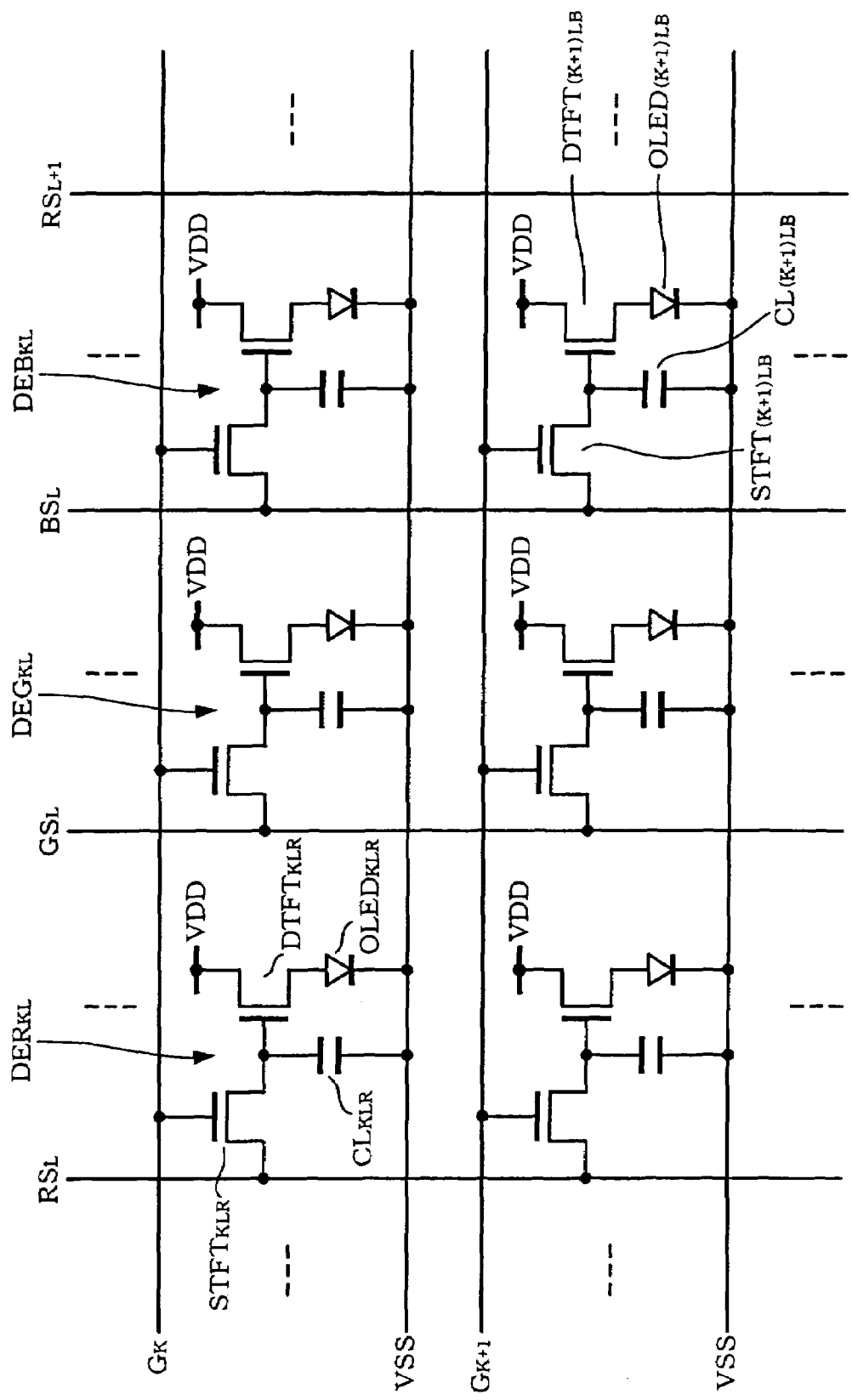
FIG. 2 shows an electrical equivalent circuit of an example of the pixels shown in FIG. 1.

FIG. 2 shows an electrical equivalent circuit of an example of the pixels $DER_{KL}$, $DEG_{KL}$, and $DEB_{KL}$ shown in FIG. 1. Each pixel includes an organic EL element. Each pixel has the same configuration, and a luminescent material of the organic EL element differs in units of color components.

Taking the pixel $DER_{KL}$ provided at the position corresponding to the intersecting point of the scan line GK and the R component data line $RS_L$ as an example, the pixel $DER_{KL}$ includes a switching transistor $STFT_{KLR}$, a driver transistor $DTFT_{KLR}$, a storage capacitor $CL_{KLR}$, and an organic EL element $OLED_{KLR}$.

A gate of the switching transistor $STFT_{KLR}$ is connected with the scan line $G_K$. A source of the switching transistor $STFT_{KLR}$ is connected with the R component data line $RS_L$. A drain of the switching transistor $STFT_{KLR}$ is connected with a gate of the driver transistor $DTFT_{KLR}$. A given high-potential-side power supply voltage VDD is supplied to a source (drain) of the driver transistor $DTFT_{KLR}$. An anode (anode electrode) of the organic EL element $OLED_{KLR}$ is connected with a drain (source) of the driver transistor $DTFT_{KLR}$. A ground power supply voltage VSS is supplied to a cathode (cathode electrode) of the organic EL element $OLED_{KLR}$. The storage capacitor $CL_{KLR}$ is inserted between the gate of the driver transistor $DTFT_{KLR}$ and a power supply line to which the ground power supply voltage VSS is supplied.

When the switching transistor $STFT_{KLR}$ is turned ON upon application of a scan voltage to the selected scan line $G_K$, a data voltage of the R component data line $RS_L$ is applied to one end of the storage capacitor $CL_{KLR}$. Therefore, an electric charge corresponding to the data voltage of the R component data line $RS_L$ is charged into the storage capacitor $CL_{KLR}$.

The data voltage of the R component data line $RS_L$ is applied to the gate of the driver transistor $DTFT_{KLR}$. This causes the driver transistor $DTFT_{KLR}$ to be turned ON, whereby voltage is supplied to the organic EL element $OLED_{KLR}$ in the forward direction. Since the voltage at one end of the storage capacitor $CL_{KLR}$ is applied to the gate of the driver transistor $DTFT_{KLR}$ after the switching transistor $STFT_{KLR}$ has been turned OFF, the voltage is continuously supplied to the organic EL element $OLED_{KLR}$ in the forward direction.

Figure 3:
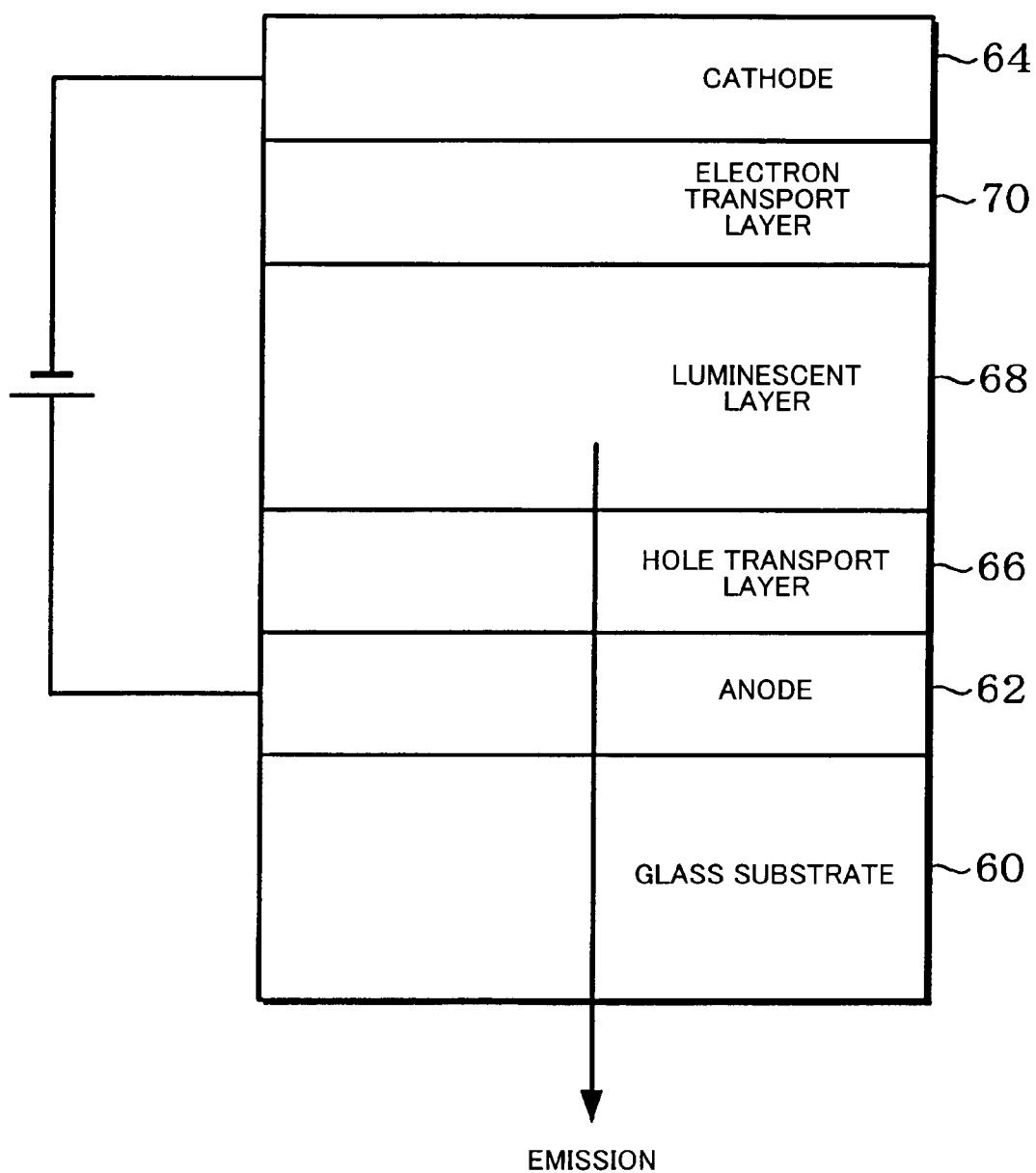
FIG. 3 shows an organic EL element.

FIG. 3 shows the organic EL element $OLED_{KLR}$.

In the organic EL element $OLED_{KLR}$, a transparent electrode (indium tin oxide (ITO), for example), which functions as an anode 62 provided as the data line, is formed on a glass substrate 60. A cathode 64 provided as the scan line is formed above the anode 62. An organic layer including a luminescent layer and the like is formed between the anode 62 and the cathode 64.

The organic layer includes a hole transport layer 66 formed on the upper surface of the anode 62, a luminescent layer 68 formed on the upper surface of the hole transport layer 66, and an electron transport layer 70 formed between the luminescent layer 68 and the cathode 64.

A hole from the anode 62 and an electron from the cathode 64 are recombined in the luminescent layer 68 by applying a potential difference between the data line and the scan line, specifically, by applying a potential difference between the anode 62 and the cathode 64. The molecules of the luminescent layer 68 are excited by the energy thus generated, and the energy released when the molecules return to the ground state becomes light. The light passes through the anode 62 formed of a transparent electrode and the glass substrate 60.

A color image can be displayed by changing the colors emitted from the luminescent layer 68 in units of color components.

In FIG. 1, the scan line driver circuit 30 scans (sequentially drives) the scan lines $G_1$ to $G_M$ of the display panel 20.

The data line driver circuit 40 drives the data lines $S_1$ to $S_N$ of the display panel 20 based on grayscale data. The data line driver circuit 40 drives the data lines using the drive signals multiplexed by time division in units of color components:

The display controller 50 controls the scan line driver circuit 30 and the data line driver circuit 40 according to the content set by a host such as a central processing unit (CPU) (not shown). In more detail, the display controller 50 provides an operation mode setting and supplies a horizontal synchronization signal and a vertical synchronization signal generated therein to the scan line driver circuit 30 and the data line driver circuit 40, for example.

In the display device 10 having such a configuration, the scan line driver circuit 30 and the data line driver circuit 40 drive the display panel 12 in combination based on grayscale data supplied from the outside under control of the display controller 50.

In FIG. 1, the display device 10 includes the display controller 50. However, the display controller 50 may be provided outside the display device 10. Or, the host may be included in the display device 10 together with the display controller 50. Some or all of the scan line driver circuit 30, the data line driver circuit 40, and the display controller 50 may be formed on the display panel 20.

In FIG. 1, a display driver may be formed as a semiconductor device (integrated circuit or IC) by integrating the scan line driver circuit 30 and the data line driver circuit 40. The display driver may include the display controller 50.

1.1 Scan Line Driver Circuit

Figure 4:
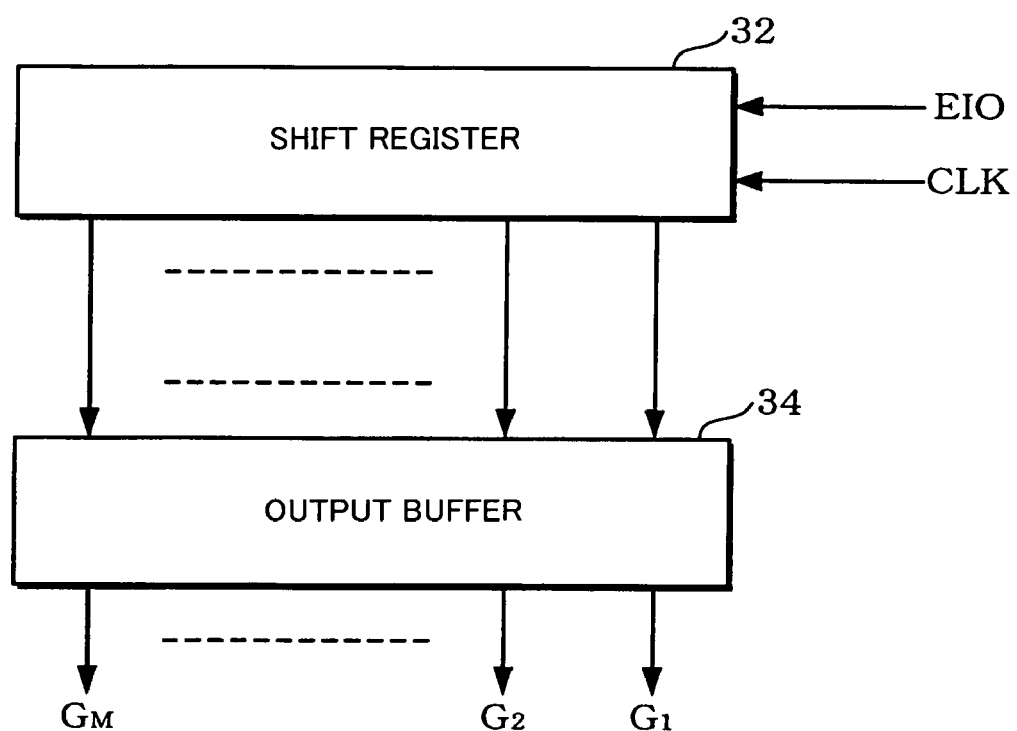
FIG. 4 shows the scan line driver circuit shown in FIG. 1.

FIG. 4 shows the scan line driver circuit 30 shown in FIG. 1.

The scan line driver circuit 30 includes a shift register 32 and an output buffer 34.

The shift register 32 includes a plurality of flip-flops which are provided corresponding to the scan lines and are sequentially connected. The shift register 32 holds an enable input-output signal EIO in the flip-flop in synchronization with a clock signal CLK, and sequentially shifts the enable input-output signal EIO to the adjacent flip-flops in synchronization with the clock signal CLK. The enable input-output signal EIO input to the shift register 32 is the vertical synchronization signal supplied from the display controller 50.

The output buffer 34 drives the scan line by buffering the shift output from the shift register 32 and outputting the shift output to the scan line.

1.2 Data Line Driver Circuit

Figure 5:
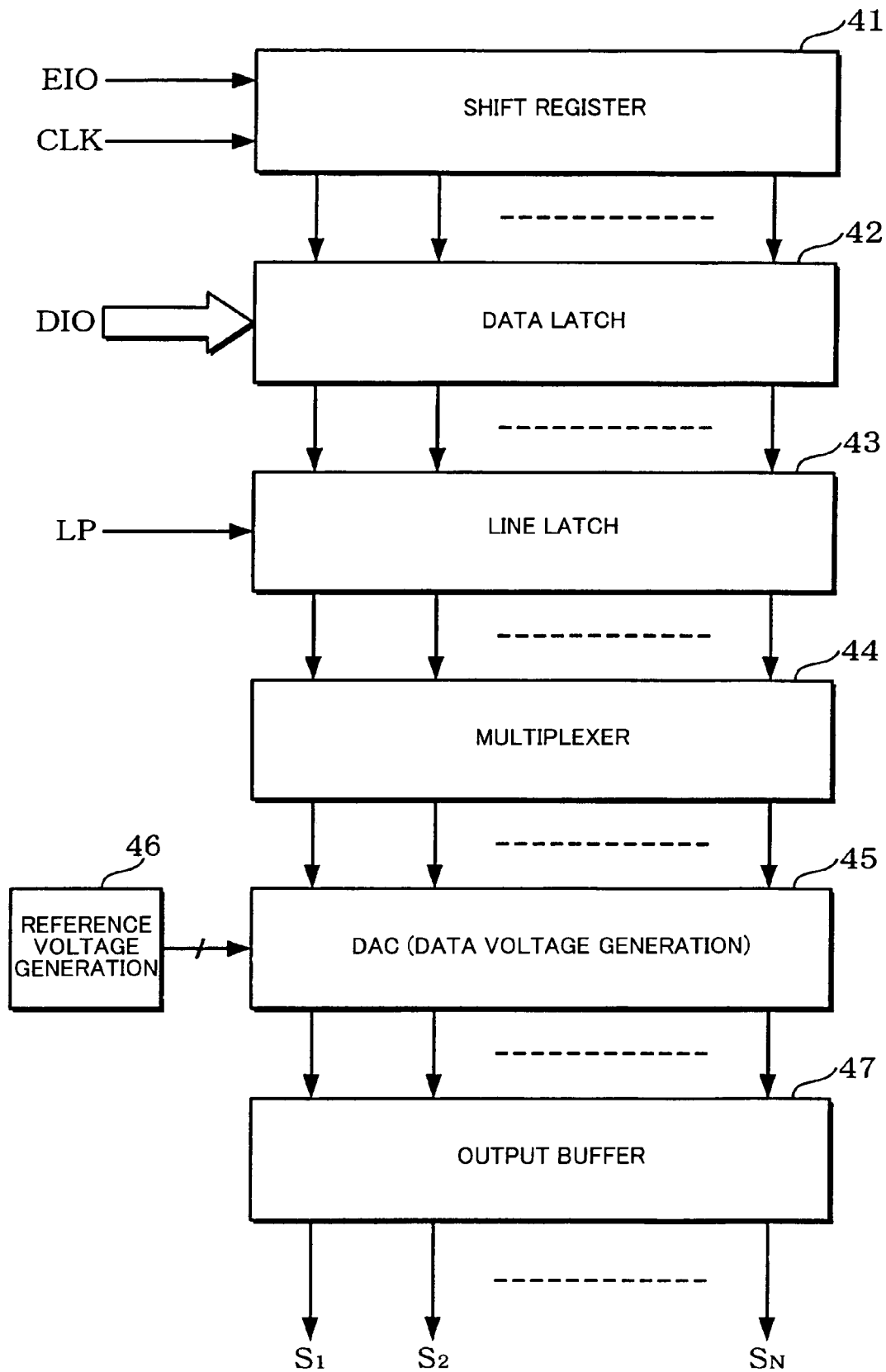
FIG. 5 is a block diagram showing the data line driver circuit shown in FIG. 1.

FIG. 5 is a block diagram showing the data line driver circuit 40 shown in FIG. 1. The following description is given on the assumption that the grayscale data for one pixel is 18 bits (grayscale data for each color component is six bits) for convenience of description. However, the present invention is not limited thereto.

The data line driver circuit (data driver) 40 includes a shift register 41, a data latch 42, a line latch 43, a multiplexer circuit 44, a digital-to-analog converter (DAC) (data voltage generation circuit in a broad sense) 45, a reference voltage generation circuit 46, and an output buffer 47.

The shift register 41 includes a plurality of flip-flops which are provided corresponding to the data lines and are sequentially connected. The shift register 41 holds the enable input-output signal EIO in synchronization with the clock signal CLK, and sequentially shifts the enable input-output signal EIO to the adjacent flip-flops in synchronization with the clock signal CLK.

Grayscale data (DIO) is input to the data latch 42 from the display controller 50 in units of 18 bits (6 bits (grayscale data)×3 (each color of RGB)), for example. The data latch 42 latches the grayscale data (DIO) in synchronization with the enable input-output signal EIO sequentially shifted by the flip-flops of the shift register 41.

The line latch 43 latches the grayscale data in one horizontal scan unit latched by the data latch 42 in synchronization with a horizontal synchronization signal LP supplied from the display controller 50.

The multiplexer circuit 44 generates multiplexed data in which the grayscale data for the R component, the G component, and the B component which form one pixel is multiplexed by time division. The time division timing of the multiplexer circuit 44 is set so that the grayscale data for the R component, the G component, and the B component is time-divided within one horizontal scan period.

The DAC 45 generates an analog data voltage (drive voltage in a broad sense) supplied to the data line. In more detail, the DAC 45 selects one of a plurality of reference voltages from the reference voltage generation circuit 46 based on the digital multiplexed data from the multiplexer circuit 44, and outputs an analog data voltage corresponding to the digital grayscale data included in the multiplexed data.

The reference voltage generation circuit 46 generates a plurality of reference voltages. The reference voltages are used in data line units. Specifically, the analog data voltage corresponding to the digital grayscale data included in the multiplexed data is selected from the reference voltages output from the reference voltage generation circuit 46 in data line units.

The output buffer 47 drives the data line by buffering the data voltage from the DAC 45 and outputting the data voltage to the data line. In more detail, the output buffer 47 includes voltage-follower-connected operational amplifier circuits (driver sections in a broad sense) provided in data line units. Each of the operational amplifier circuits converts the data voltage from the DAC 47 by impedance conversion, and outputs the converted data voltage to the data line.

Figure 6:
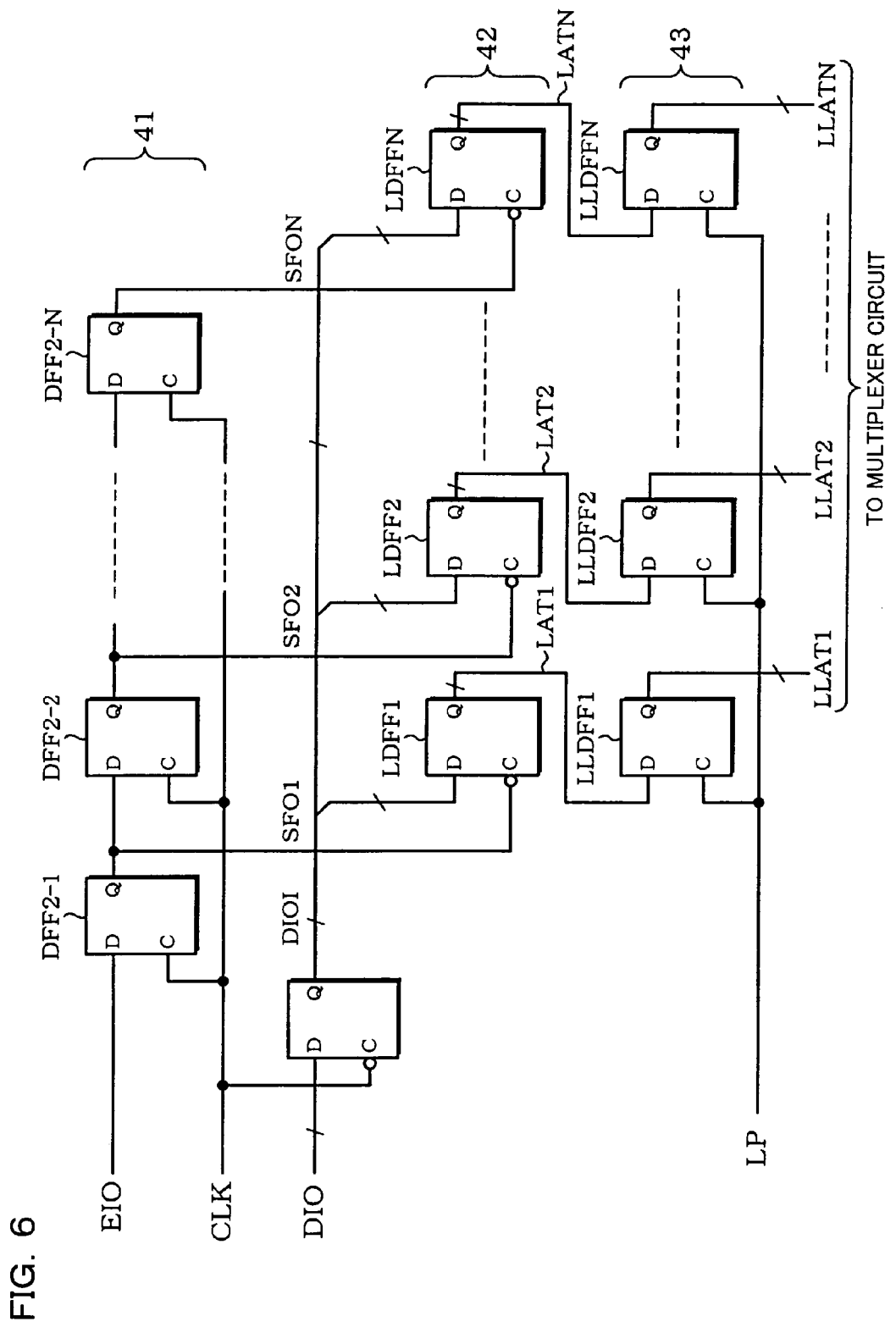
FIG. 6 is a circuit diagram showing the shift register, the data latch, and the line latch shown in FIG. 5.

FIG. 6 is a circuit diagram showing the shift register 41, the data latch 42, and the line latch 43 shown in FIG. 5.

The shift register 41 includes first to N-th DFFs DFF2-1 to DFF2-N. In the following description, the i-th ($1 \leq i \leq N$, i is an integer) DFF is indicated by DFF2-i. The shift register 41 is formed by connecting the DFFs DFF2-1 to DFF2-N in series. Specifically, a data output terminal Q of the DFF DFF2-j ($1 \leq j \leq N-1$, j is an integer) is connected with a data input terminal D of the DFF DFF2–(j+1) in the subsequent stage.

Shift outputs SFO1 to SFON are output from the data output terminals Q of the DFFs DFF2-1 to DFF2-N. The enable input-output signal EIO is input to the data input terminal D of the DFF DFF2-1. The clock signal (dot clock signal) CLK is input to clock input terminals C of the DFFs DFF2-1 to DFF2-N.

The data latch 42 includes first to N-th latch DFFs. In the following description, the i-th ($1 \leq i \leq N$, i is an integer) latch DFF is indicated by LDFFi. The latch DFF LDFF holds a signal input to a data input terminal D at the falling edge of a signal input to a clock input terminal C. The latch DFF LDFF holds data in the number of bits of the grayscale data which forms one pixel. Specifically, 18-bit data, of which the number of bits is the sum of the number of bits "6" of the R component grayscale data, the number of bits "6" of the G component grayscale data, and the number of bits "6" of the B component grayscale data, is input to the data input terminal D of each latch DFF LDFF. The shift output SFOi from the shift register 41 is supplied to the clock input terminal C of the latch DFF LDFFi. Latch data LATi is data from the data output terminal Q of the latch DFF LDFFi. Grayscale latch data, which is the grayscale data DIO synchronized with the falling edge of the clock signal CLK, is input to the data input terminals D of the latch DFFs LDFF1 to LDFFN.

The line latch 43 includes first to N-th line latch DFFs. In the following description, the i-th ($1 \leq i \leq N$, i is an integer) line latch DFF is indicated by LLDFFi.

The line latch DFF LLDFFi holds data in the number of bits of the grayscale data which forms one pixel. The horizontal synchronization signal LP is supplied to a clock input terminal C of the line latch DFF LLDFFi. Line latch data LLATi is data from a data output terminal Q of the line latch DFF LLDFFi. The data output terminal Q of the latch DFF LDFFi is connected with a data input terminal D of the line latch DFF LLDFFi.

The DFFs DFF1-1 to DFF-1-N, LDFF1 to LDFFN, and LLDFF1 to LLDFFN are initialized by an inversion reset signal (not shown).

Figure 7:
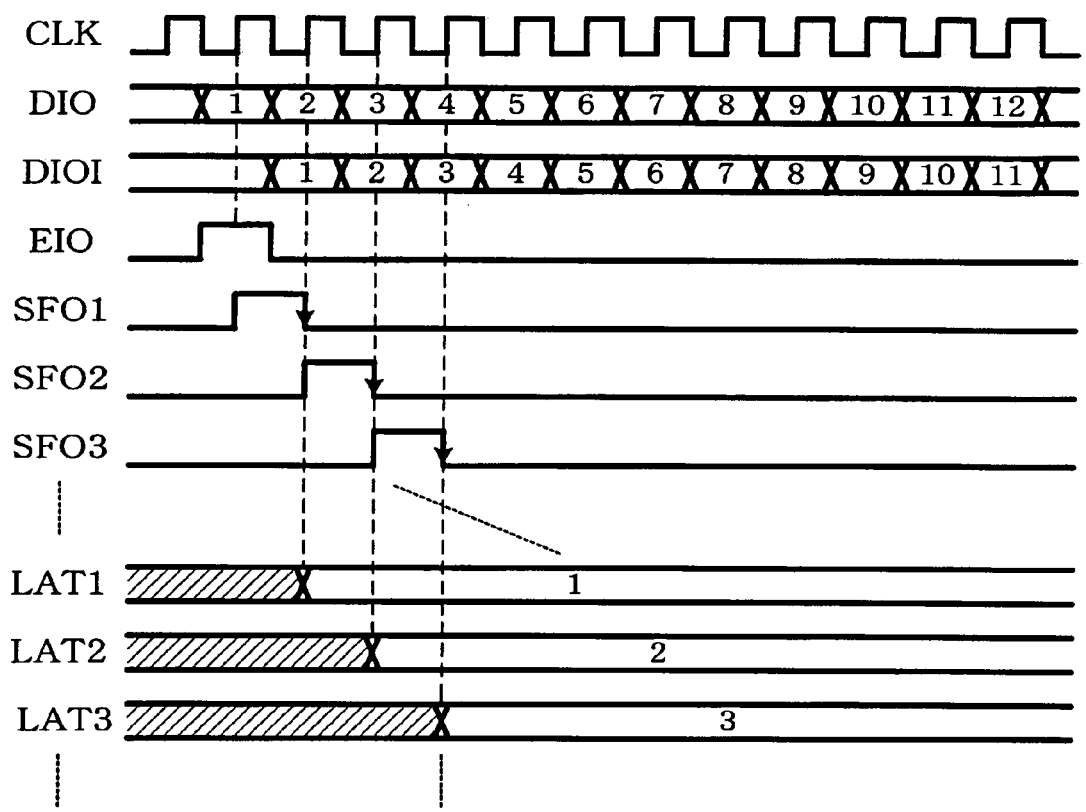
FIG. 7 is a timing chart showing an operation example of the shift register and the data latch shown in FIG. 6.

FIG. 7 is a timing chart showing an operation example of the shift register 41 and the data latch 42 shown in FIG. 6.

The grayscale data for one pixel including the R component grayscale data, the G component grayscale data, and the B component grayscale data is sequentially supplied to the data latch 42 as the grayscale data DIO in synchronization with the clock signal CLK.

The enable input-output signal EIO is set at the H level corresponding to the head position of the grayscale data DIO. In the shift register 41, the shift operation of the enable input-output signal EIO is performed. Specifically, the shift register 41 stores the enable input-output signal EIO at the rising edge of the clock signal CLK. The shift register 41 sequentially outputs pulses shifted in synchronization with the rising edge of the clock signal CLK as the shift outputs SFO1 to SFON in each stage.

The data latch 42 stores the grayscale latch data at the falling edge of the shift output from each stage of the shift register 41. As a result, the data latch 42 stores the grayscale latch data in the order of the latch DFFs LDFF1, LDFF2 . . . . The grayscale data stored in the latch DFFs LDFF1 to LDFFN is respectively output as the latch data LAT1 to LATN.

The line latch 43 latches the data stored in the data latch 42 in units of one horizontal scan period. The grayscale data for one horizontal scan latched by the line latch 43 is supplied to the multiplexer circuit 44.

Figure 8:
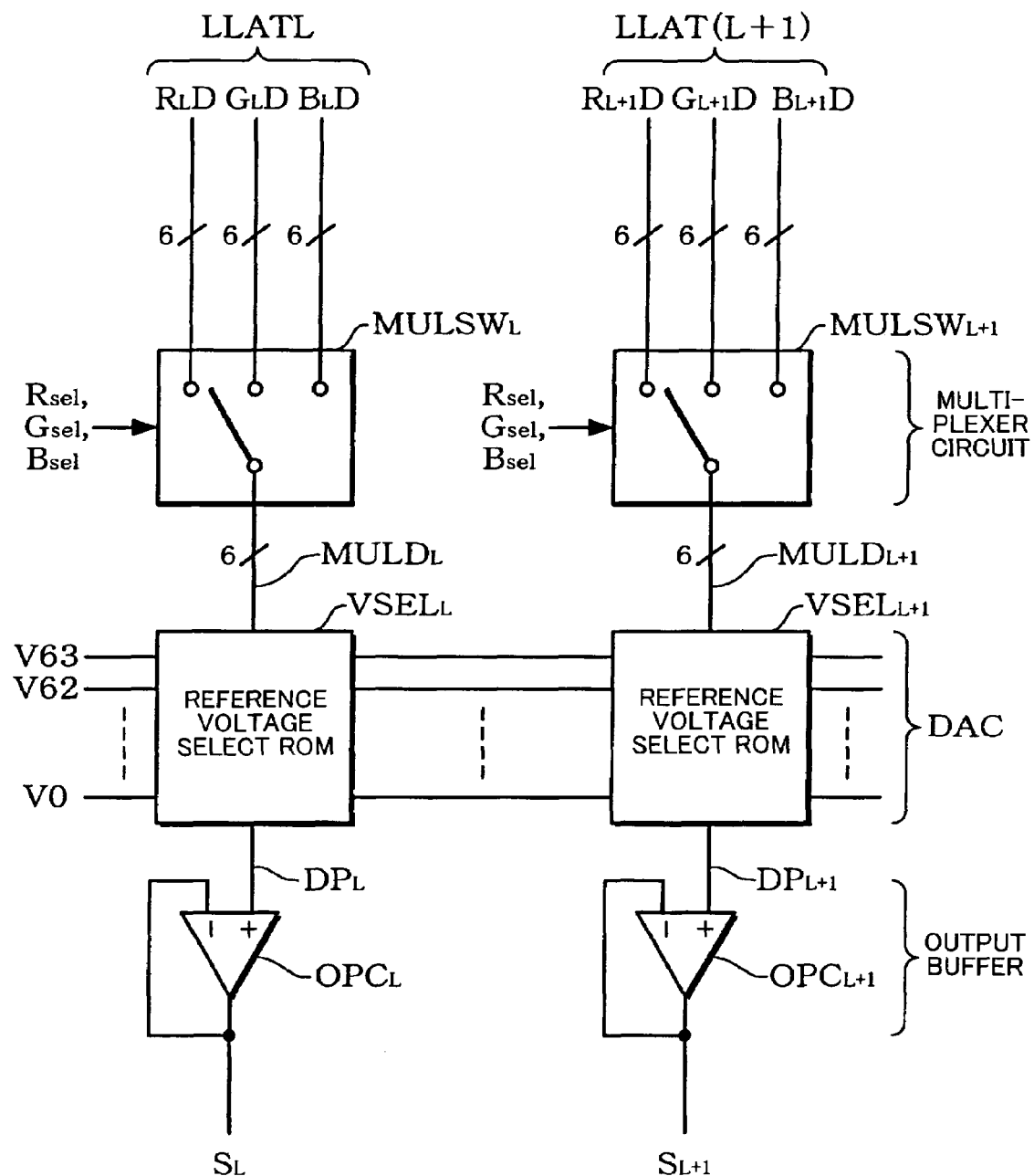
FIG. 8 shows the multiplexer circuit, the DAC, and the output buffer shown in FIG. 6.

FIG. 8 shows the multiplexer circuit 44, the DAC 45, and the output buffer 47 shown in FIG. 6. FIG. 8 shows only the data lines SL and $S_{L+1}$ to which the line latch data LLATL and LLAT(L+1) is respectively supplied. However, the same description also applies to other data lines.

The line latch data LLATL includes 6-bit R component grayscale data $R_L D$, 6-bit G component grayscale data $G_L D$, and 6-bit B component grayscale data $B_L D$. The line latch data LLAT(L+1) includes 6-bit R component grayscale data $R_{L+1}D$, 6-bit G component grayscale data $G_{L+1}D$, and 6-bit B component grayscale data $B_{L+1}D$.

The multiplexer circuit 44 generates multiplexed data in data line units based on an R component select signal Rse1, a G component select signal Gse1, and a B component select signal Bse1. In more detail, the multiplexer circuit 44 includes multiplex switches $MULSW_1$ to $MULSW_N$ in data line units. In FIG. 8, the multiplex switch $MULSW_L$ provided corresponding to the data line $S_L$ generates 6-bit multiplexed data $MULD_L$ in which the R component grayscale data $R_LD$, the G component grayscale data $G_LD$, and the B component grayscale data $B_LD$ are multiplexed based on the R component select signal Rse1, the G component select signal Gse1, and the B component select signal Bse1. The multiplex switch MULSWL+L provided corresponding to the data line $S_{L+1}$ generates 6-bit multiplexed data $MULD_{L+1}$ in which the R component grayscale data $R_{L+1}D$, the G component grayscale data $G_{L+1}D$, and the B component grayscale data $B_{L+1}D$ are multiplexed based on the R component select signal Rse1, the G component select signal Gse1, and the B component select signal Bse1.

The DAC 45 includes reference voltage select read only memory (ROM) circuits $VSEL_1$ to $VSEL_N$ provided in data line units. In FIG. 8, the reference voltage select ROM circuit $VSEL_L$ provided corresponding to the data line $S_L$ selects one of the reference voltages from the reference voltage generation circuit 46 in units of color components based on the multiplexed data $MULD_L$. Specifically, the reference voltage select ROM circuit $VSEL_L$ selects one of the reference voltages based on the R component grayscale data $R_LD$ multiplexed into the multiplexed data $MULD_L$. The reference voltage select ROM circuit $VSEL_L$ selects one of the reference voltages based on the G component grayscale data $G_LD$ multiplexed into the multiplexed data $MULD_L$. The reference voltage select ROM circuit $VSEL_L$ selects one of the reference voltages based on the B component grayscale data $B_LD$ multiplexed into the multiplexed data $MULD_L$.

Since the number of bits of each color component grayscale data is six, the reference voltage generation circuit 46 generates 64 (=$2^6$) types of reference voltages V0 to V63. The reference voltage generation circuit 46 outputs R component reference voltages V0R to V63R, G component reference voltages V0G to V63G, or B component reference voltages V0B to V63B as the reference voltages V0 to V63 corresponding to the time division timing of the color component grayscale data of the multiplexed data $MULD_1$ to $MULD_N$.

The output buffer 47 includes a plurality of operational amplifier circuits $OPC_1$ to $OPC_L$ provided in data line units. In FIG. 8, the operational amplifier circuit $OPC_L$ drives the data line $S_L$ based on a data voltage $DP_L$ output from the reference voltage select ROM circuit $VSEL_L$.

Figure 9:
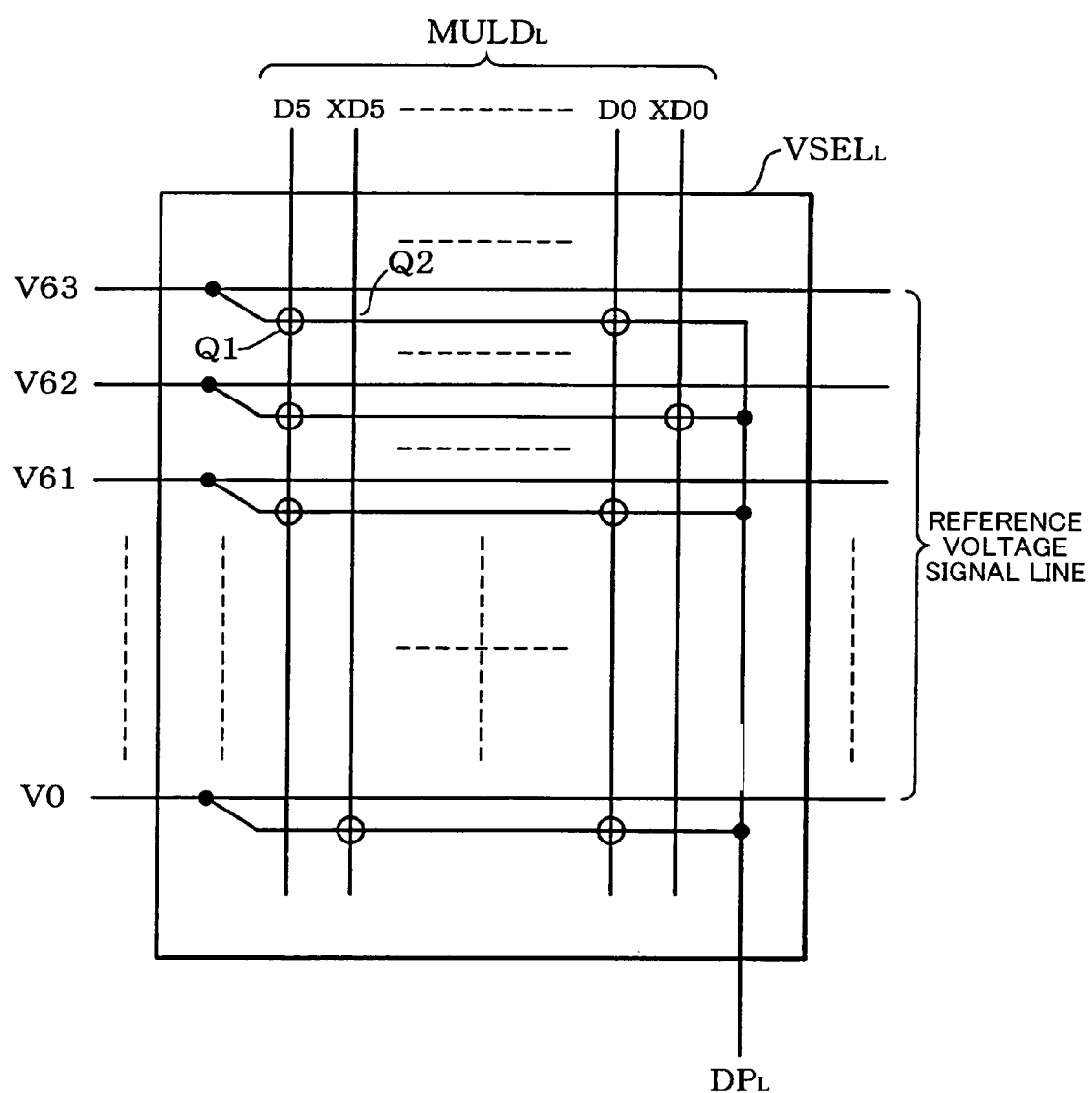
FIG. 9 schematically shows the reference voltage select ROM circuit shown in FIG. 8.

FIG. 9 schematically shows the reference voltage select ROM circuit $VSEL_L$ shown in FIG. 8. FIG. 9 shows a configuration of the reference voltage select ROM circuit $VSEL_L$. However, the reference voltage select ROM circuits $VSEL_1$ to $VSEL_N$ have the same configuration as the reference voltage select ROM circuit $VSEL_L$.

Non-inverted data D5 to D0 which is the 6-bit multiplexed data $MULD_L$ and inverted data XD5 to XD0 obtained by reversing each bit of the non-inverted data D5 to D0 are input to the reference voltage select ROM circuit $VSEL_L$. One of 64 reference voltage signal lines to which the reference voltages V0 to V63 are supplied is electrically connected with a signal line to which the data voltage $DP_L$ is supplied corresponding to the pattern of each bit of the non-inverted data D5 to D0 and the inverted data XD5 to XD0.

For example, the non-inverted data D5 is supplied to a gate of a transistor element Q1, and a grayscale voltage signal line to which the reference voltage V63 is supplied is connected with a source of the transistor element Q1. A source of a transistor Q2 is connected with a drain of the transistor Q1. The inverted data XD5 is supplied to a gate of the transistor Q2, and a source of a transistor Q3 (not shown) is connected with a drain of the transistor Q2. However, a channel region is formed in the transistor Q2 by ion implantation so that the transistor Q2 is always in the ON state. One of the reference voltages can be output as the data voltage $DP_L$ based on the non-inverted data D5 to D0 and the inverted data XD5 to XD0 by configuring the reference voltage select ROM circuit $VSEL_L$ as described above.

Figure 10:
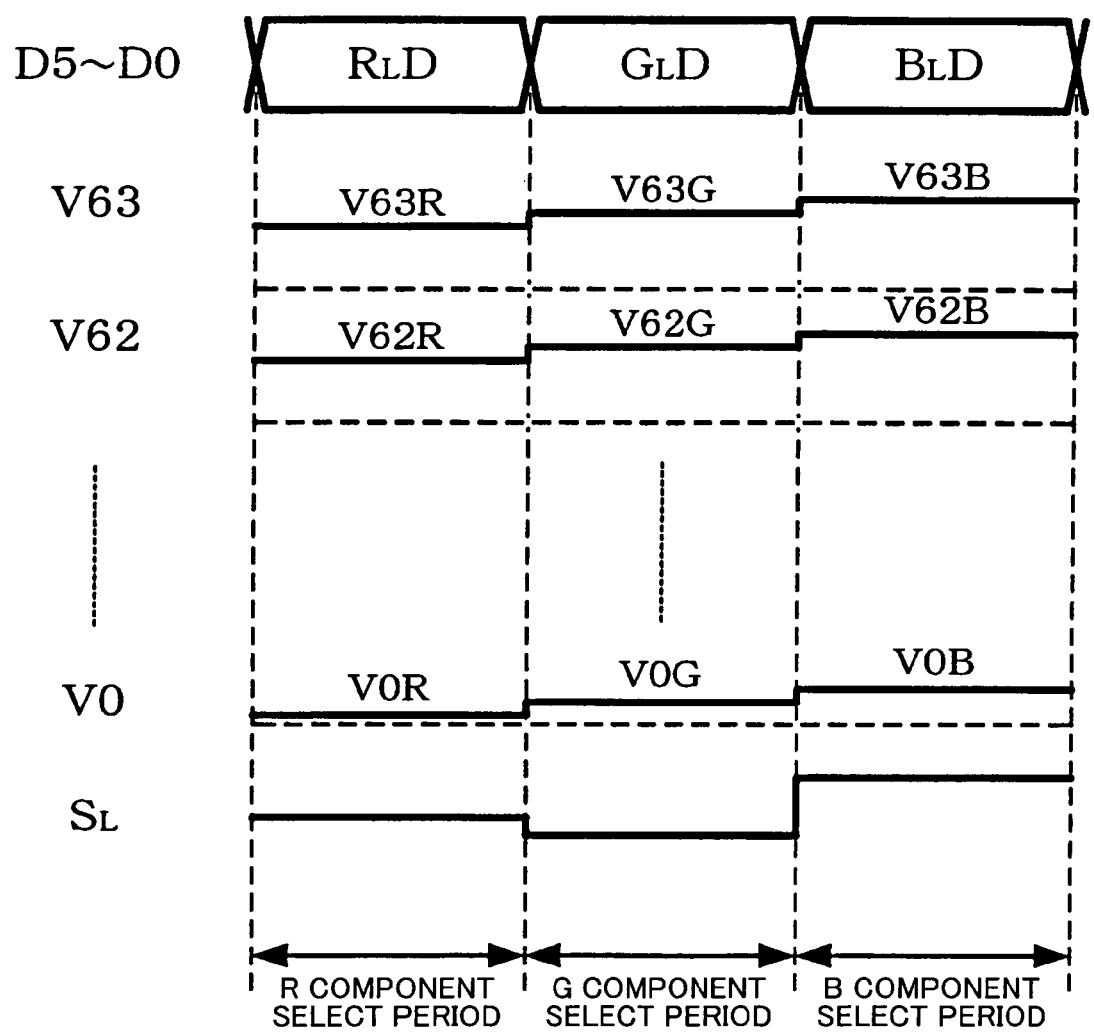
FIG. 10 is a timing chart showing an operation example of the reference voltage select ROM circuit.

FIG. 10 is a timing chart showing an operation example of the reference voltage select ROM circuit $VSEL_L$. FIG. 10 shows an operation example of the reference voltage select ROM circuit $VSEL_L$. However, the operations of other reference voltage select ROM circuits are the same as described below.

In an R component select period specified by the R component select signal Rse1, the R component reference voltages V0R to V63R are supplied to the reference voltage select ROM circuit $VSEL_L$ as the reference voltages V0 to V63. In a G component select period specified by the G component select signal Gse1, the G component reference voltages V0G to V63G are supplied to the reference voltage select ROM circuit $VSEL_L$ as the reference voltages V0 to V63. In a B component select period specified by the B component select signal Bse1, the B component reference voltages V0B to V63B are supplied to the reference voltage select ROM circuit $VSEL_L$ as the reference voltages V0 to V63.

In the R component select period, one reference voltage corresponding to the R component grayscale data $R_LD$ is selected from among the R component reference voltages V0R to V63R, and the data line $S_L$ is driven based on the selected reference voltage. In the G component select period, one reference voltage corresponding to the G component grayscale data $G_LD$ is selected from among the G component reference voltages V0G to V63G, and the data line SL is driven based on the selected reference voltage. In the B component select period, one reference voltage corresponding to the B component grayscale data $B_LD$ is selected from among the B component reference voltages V0B to V63B, and the data line SL is driven based on the selected reference voltage.

As described above, 64 types of reference voltages V0 to V63 for each color component are selectively supplied to the reference voltage select ROM circuit $VSEL_L$ in synchronization with the time division timing of the color component grayscale data in the multiplexed data $MULD_L$. The reference voltage select ROM circuit $VSEL_L$ outputs the data voltage $DP_L$ which is changed in potential in synchronization with the time division timing of the color component grayscale data in the multiplexed data $MULD_L$.

2. Reference Voltage Generation Circuit

Figure 11:
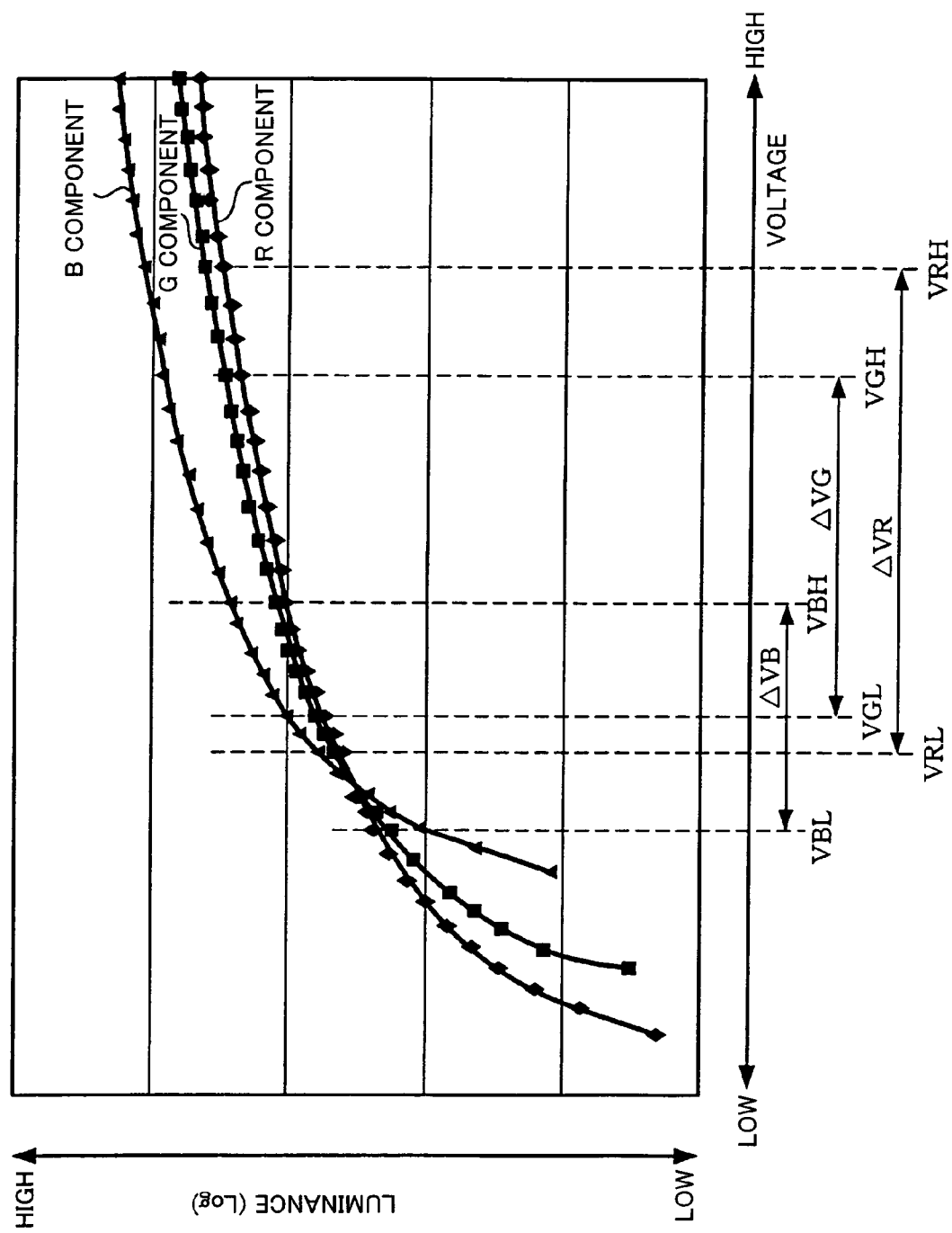
FIG. 11 shows an example of voltage-luminance characteristics of the organic EL elements for each color component.

FIG. 11 shows an example of voltage-luminance characteristics of the organic EL elements for each color component. In FIG. 11, the horizontal axis indicates the voltage applied to the organic EL element, and the vertical axis indicates the luminance of the organic EL element. FIG. 11 shows the relationship between the applied voltage and the luminance of the organic EL element for each color component.

As shown in FIG. 11, the luminance differs in units of color components even if the applied voltage is the same. Therefore, in the case of driving a panel in which a pixel includes an organic EL element having the voltage-luminance characteristics shown in FIG. 11, it is necessary to generate different data voltages in units of color components even if the grayscale data is the same for different color components. Therefore, the reference voltage generation circuit must change the reference voltages in units of color components.

As is clear from FIG. 11, the voltage at which the B component starts emitting light is higher in comparison with the R component and the G component. The B component has a higher luminance in comparison with the R component and the G component after emission of light has started. The reference voltage generation circuit in this embodiment can generate different reference voltages in units of color components taking such voltage-luminance characteristics (grayscale characteristics) into consideration.

The reference voltage generation circuit in this embodiment is described below in detail.

Figure 12:
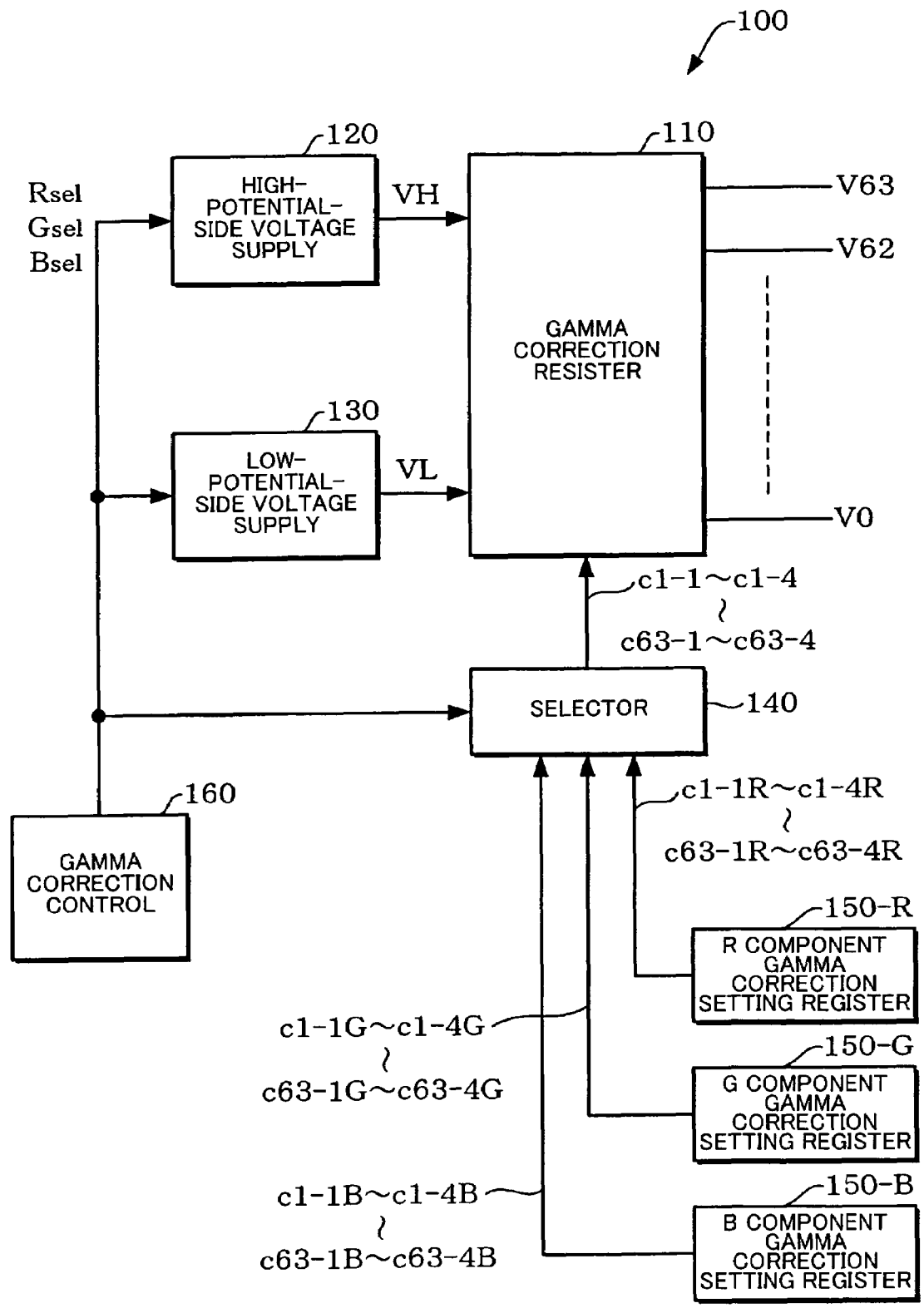
FIG. 12 is a block diagram showing the reference voltage generation circuit in an embodiment of the present invention.

FIG. 12 is a block diagram showing the reference voltage generation circuit in an embodiment of the present invention.

A reference voltage generation circuit 100 shown in FIG. 12 may be used as the reference voltage generation circuit 46 shown in FIG. 5. The reference voltage generation circuit 100 includes a gamma correction resistor circuit 110, a high-potential-side voltage supply circuit (first voltage supply circuit) 120, and a low-potential-side voltage supply circuit (second voltage supply circuit) 130.

Figure 13:
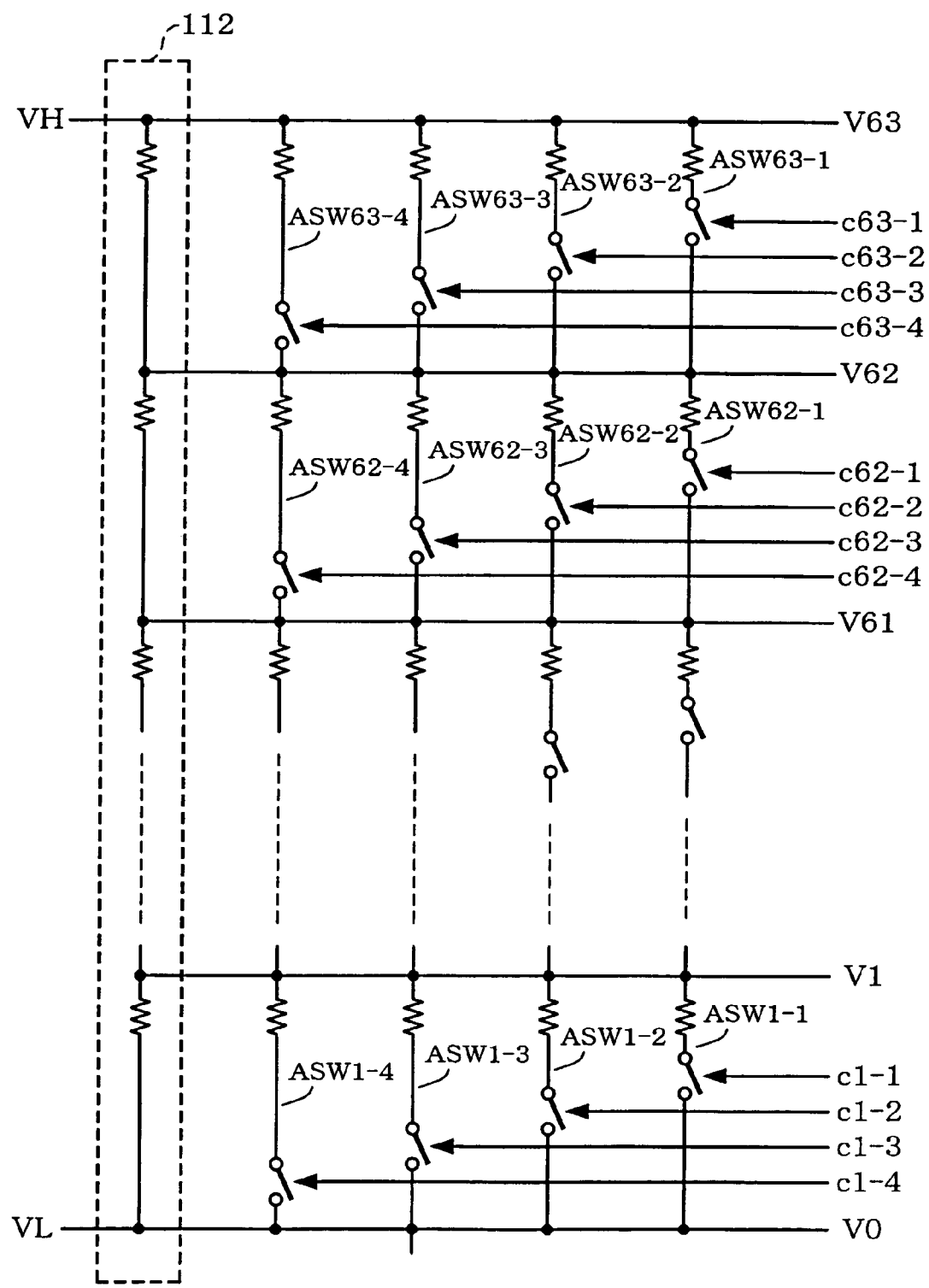
FIG. 13 is a circuit diagram showing the gamma correction resistor circuit shown in FIG. 12.

FIG. 13 is a circuit diagram showing the gamma correction resistor circuit 110 shown in FIG. 12.

The gamma correction resistor circuit 110 includes a resistor circuit 112. A high-potential-side voltage VH and a low-potential-side voltage VL are supplied to either end of the resistor circuit 112. The resistor circuit 112 generates a plurality of reference voltages, each of which is generated by resistively dividing the voltage across the resistor circuit 112. One of the reference voltage signal lines is connected with each of a plurality of resistive division nodes of the resistor circuit 112, and one of the reference voltages is output to each of the reference voltage signal lines.

In FIG. 12, the high-potential-side voltage supply circuit 120 supplies the high-potential-side voltage VH of the resistor circuit 112. The high-potential-side voltage supply circuit 120 changes the high-potential-side voltage VH in units of color components which form one pixel, and supplies the high-potential-side voltage VH to one end of the resistor circuit 112.

The low-potential-side voltage supply circuit 130 supplies the low-potential-side voltage VL of the resistor circuit 112. The low-potential-side voltage supply circuit 130 changes the low-potential-side voltage VL in units of color components which form one pixel, and supplies the low-potential-side voltage VL to one end of the resistor circuit 112.

In this embodiment, it suffices that the high-potential-side voltage supply circuit 120 and the low-potential-side voltage supply circuit 130 be able to change at least one of the high-potential-side voltage and the low-potential-side voltage in units of color components which form one pixel.

The gamma correction resistor circuit 110 thus generates 64 types of reference voltages V0 to V63, and supplies the reference voltages V0 to V63 to each of the reference voltage select ROM circuits having the configuration shown in FIG. 9 and provided in data line units. Specifically, the gamma correction resistor circuit 110 outputs a plurality of reference voltages changed in units of color components to a plurality of reference voltage signal lines for selecting the voltages for the operational amplifier circuits $OPC_L$ and $OPC_{L+1}$ (first and second driver sections) to respectively drive the data lines $S_L$ and $S_{L+1}$ (first and second data lines) of the display panel (electro-optical device) 20.

In this embodiment, the grayscale data is multiplexed by time division in units of color components which form one pixel, and the high-potential-side voltage supply circuit 120 and the low-potential-side voltage supply circuit 130 change at least one of the high-potential-side voltage and the low-potential-side voltage in units of color components at a time division timing of each color component of the grayscale data, and supply the high-potential-side voltage and the low-potential-side voltage to either end of the resistor circuit 112.

In FIG. 13, the gamma correction resistor circuit 110 may further include at least one correction switch circuit in addition to the resistor circuit 112. The correction switch circuit is inserted between two of the resistive division nodes of the resistor circuit 112. The correction switch circuit includes a resistor element and a switch element connected in series. The correction switch circuit electrically connects or disconnects the resistive division nodes between which the correction switch circuit is inserted. At least one of the reference voltages can be caused to differ in units of color components by using the correction switch circuit.

In FIG. 13, the gamma correction resistor circuit 110 includes a plurality of correction switch circuits. In more detail, the gamma correction resistor circuit 110 includes a plurality of correction switch circuits provided in the shape of a matrix.

In more detail, the gamma correction resistor circuit 110 includes a plurality of correction switch circuits ASW1-1 to ASW1-4, . . . , ASW62-1 to ASW62-4, and ASW63-1 to ASW63-4 connected between the resistive division nodes of the resistor circuit 112. For example, the correction switch circuits ASW1-1 to ASW1-4 are inserted between two resistive division nodes connected with two reference voltage signal lines which supply the reference voltages V0 and V1. The correction switch circuits ASW62-1 to ASW62-4 are inserted between two resistive division nodes connected with two reference voltage signal lines which supply the reference voltages V61 and V62. The correction switch circuits ASW63-1 to ASW63-4 are inserted between two resistive division nodes connected with two reference voltage signal lines which supply the reference voltages V62 and V63. The switch elements of the correction switch circuit ASW1-1 to ASW1-4 are ON/OFF controlled by correction switch control signals c1-1 to c1-4, respectively. The switch elements of the correction switch circuit ASW62-1 to ASW62-4 are ON/OFF controlled by correction switch control signals c62-1 to c62-4, respectively. The switch elements of the correction switch circuit ASW63-1 to ASW63-4 are ON/OFF controlled by correction switch control signals c63-1 to c63-4, respectively.

In this embodiment, the resistive dividing ratio between the resistive division nodes of the resistor circuit 112 can be caused to differ in units of color components by using the correction switch control signals.

The resistances of the resistor elements of the correction switch circuits connected between the same resistive division nodes may be the same, or may differ at a predetermined ratio (1:2:4:8, for example). In this embodiment, it is preferable that the resistance between the resistive division nodes of the resistor circuit 112 have the following relationship.

Figure 14:
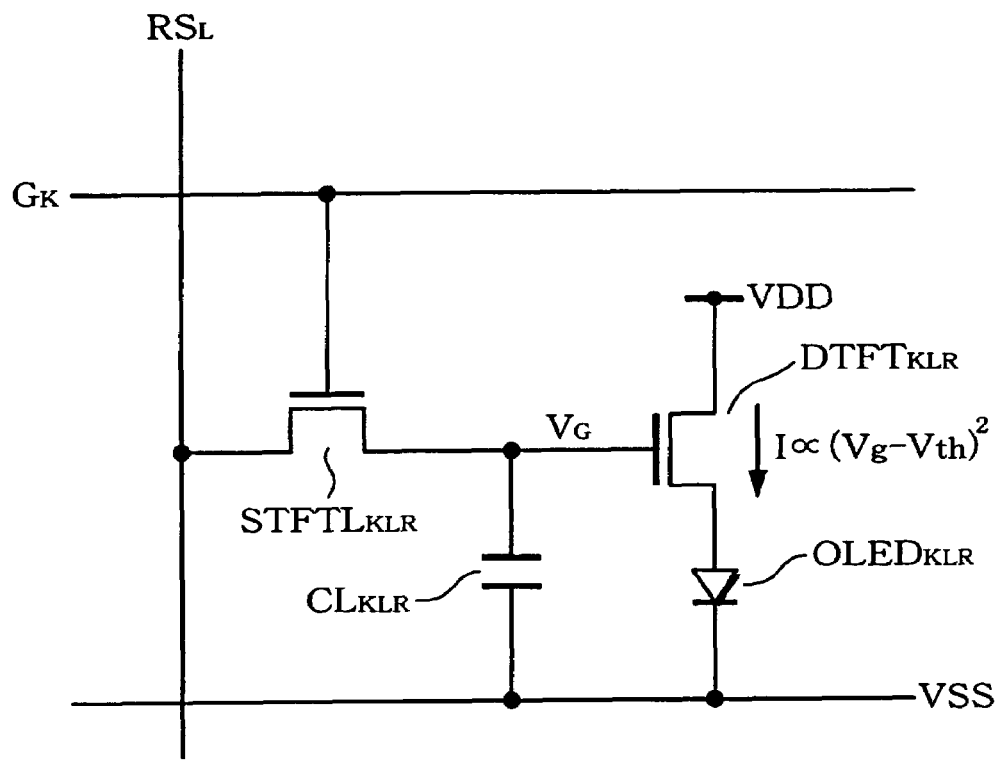
FIG. 14 shows an equivalent circuit of a pixel of an active matrix type display panel.

FIG. 14 shows an equivalent circuit of a pixel of an active matrix type display panel. FIG. 14 shows only the pixel $DER_{KL}$ shown in FIG. 2.

It is known that the luminance of the organic EL element $OLED_{KLR}$ is increased in proportion to power consumption. When current which flows through the organic EL element $OLED_{KLR}$ is indicated by I, power consumption is proportional to $I^2$. Therefore, the luminance of the organic EL element $OLED_{KLR}$ is proportional to the second power of a drain current Id of the driver transistor $DTFT_{KLR}$ shown in FIG. 14.

When a gate voltage and a threshold voltage of the driver transistor $DTFT_{KLR}$ are respectively indicated by Vg and Vth, the drain current Id of the transistor in the saturation region is proportional to $(Vg-Vth)^2$. Specifically, the gate voltage Vg of the driver transistor $DTFT_{KLR}$ and the luminance of the organic EL element $OLED_{KLR}$ have almost a linear relationship. Since the gate voltage Vg of the driver transistor $DTFT_{KLR}$ is almost equal to the data voltage of the R component data line RSL, it suffices that the reference voltages V0 to V63 from which the data voltage is selected have almost a linear relationship. This is realized by equalizing the resistance between the resistive division nodes of the resistor circuit 112. It is preferable to finely adjust the reference voltage by using the correction switch circuit shown in FIG. 13 corresponding to the characteristics of the display panel, manufacturing variation of the display panel, and visual characteristics of the human eye.

As described above, in the case of applying the reference voltage generation circuit 100 in this embodiment to a data line driver circuit which drives a panel including the pixel shown in FIG. 14, it is preferable that the resistance between the resistive division nodes of the resistor circuit 112 be the same.

The reference voltage generation circuit 100 in this embodiment is not limited to the resistance between the resistive division nodes of the resistor circuit 112. The reference voltage generation circuit 100 may also be applied to a data line driver circuit which drives a simple matrix type display panel including an organic EL element.

In FIG. 12, a selector 140 generates the correction switch control signals c1-1 to c1-4, ..., c62-1 to c62-4, and c63-1 to c63-4. The selector 140 can output the correction switch control signals c1-1 to c1-4, ..., c62-1 to c62-4, and c63-1 to c63-4 in units of color components.

In more detail, R component correction switch control signals c1-1R to c1-4R, ..., c62-1R to c62-4R, and c63-1R to c63-4R, G component correction switch control signals c1-1G to c1-4G, ..., c62-1G to c62-4G, and c63-1G to c63-4G, and B component correction switch control signals c1-1B to c1-4B, ..., c62-1B to c62-4B, and c63-1B to c63-4B are supplied to the selector 140. The selector 140 outputs the R component correction switch control signals c1-1R to c1-4R, ..., c62-1R to c62-4R, and c63-1R to c63-4R as the correction switch control signals c1-1 to c1-4, ..., c62-1 to c62-4, and c63-1 to c63-4 when the R component select signal Rsel is active. The selector 140 outputs the G component correction switch control signals c1-1G to c1-4G, ..., c62-1G to c62-4G, and c63-1G to c63-4G as the correction switch control signals c1-1 to c1-4, ..., c62-1 to c62-4, and c63-1 to c63-4 when the G component select signal Gsel is active. The selector 140 outputs the B component correction switch control signals c1-1B to c1-4B, ..., c62-1B to c62-4B, and c63-1B to c63-4B as the correction switch control signals c1-1 to c1-4, ..., c62-1 to c62-4, and c63-1 to c63-4 when the B component select signal Bsel is active.

The R component correction switch control signals c1-1R to c1-4R, ..., c62-1R to c62-4R, and c63-1R to c63-4R are generated based on a value set in an R component gamma correction setting register 150-R. The G component correction switch control signals c1-1G to c1-4G, ..., c62-1G to c62-4G, and c63-1G to c63-4G are generated based on a value set in a G component gamma correction setting register 150-G. The B component correction switch control signals c1-1B to c1-4B, ..., c62-1B to c62-4B, and c63-1B to c63-4B are generated based on a value set in a B component gamma correction setting register 150-B. The values are set in the R component gamma correction setting register 150-R, the G component gamma correction setting register 150-G, and the B component gamma correction setting register 150-B by the display controller 50.

The reference voltage generation circuit 100 includes a gamma correction control circuit 160. The gamma correction control circuit 160 generates the R component select signal Rsel, the G component select signal Gsel, and the B component select signal Bsel. The R component select signal Rsel, the G component select signal Gsel, and the B component select signal Bsel are generated so that these signals do not become active at the same time. The gamma correction control circuit 160 may be provided outside the reference voltage generation circuit 100.

The high-potential-side voltage supply circuit 120, the low-potential-side voltage supply circuit 130, and the gamma correction control circuit 160 are described below.

Figure 15:
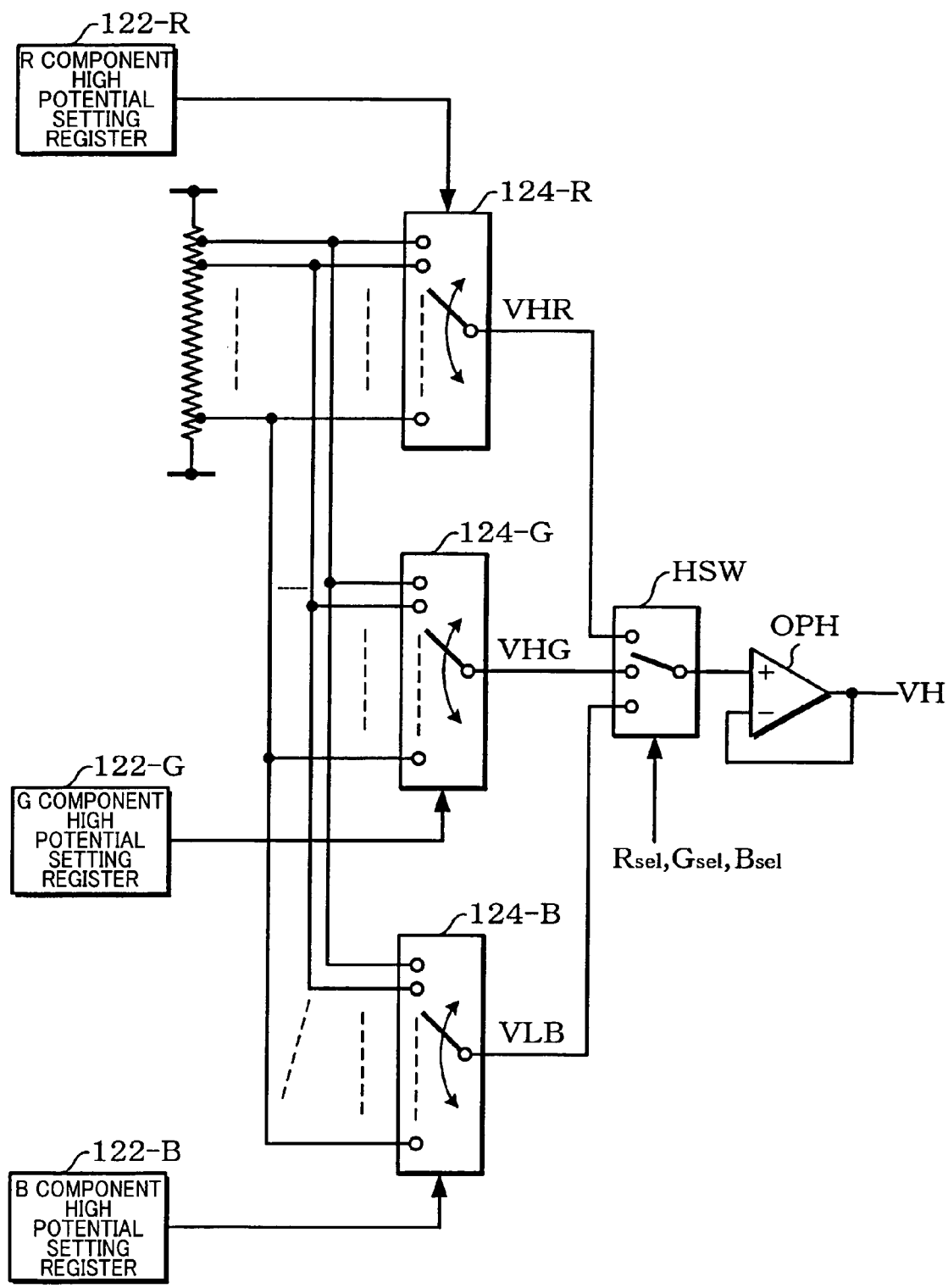
FIG. 15 is a block diagram showing the high-potential-side voltage supply circuit shown in FIG. 12.

FIG. 15 is a block diagram showing the high-potential-side voltage supply circuit 120 shown in FIG. 12.

The high-potential-side voltage supply circuit 120 outputs one of an R component high-potential-side voltage VHR, a G component high-potential-side voltage VHG, and a B component high-potential-side voltage VHB as the high-potential-side voltage VH. Therefore, the high-potential-side voltage supply circuit 120 includes a high-potential-side voltage supply switch HSW.

The high-potential-side voltage supply switch HSW outputs the R component high-potential-side voltage VHR as the high-potential-side voltage VH when the R component select signal Rsel is active. The high-potential-side voltage supply switch HSW outputs the G component high-potential-side voltage VHG as the high-potential-side voltage VH when the G component select signal Gsel is active. The high-potential-side voltage supply switch HSW outputs the B component high-potential-side voltage VHB as the high-potential-side voltage VH when the B component select signal Bsel is active.

The R component high-potential-side voltage VHR is output as one of a plurality of reference high-potential-side voltages obtained by resistively dividing a given voltage based on a value set in an R component high potential setting register 122-R. The G component high-potential-side voltage VHG is output as one of a plurality of reference high-potential-side voltages obtained by resistively dividing a given voltage based on a value set in a G component high potential setting register 122-G. The B component high-potential-side voltage VHB is output as one of a plurality of reference high-potential-side voltages obtained by resistively dividing a given voltage based on a value set in a B component high potential setting register 122-B.

The values are set in the R component high potential setting register 122-R, the G component high potential setting register 122-G, and the B component high potential setting register 122-B by the display controller 50.

As described above, in the high-potential-side voltage supply circuit 120, one of the high-potential-side voltages generated in units of color components is selected by the high-potential-side voltage supply switch HSW. A voltage-follower-connected operational amplifier OPH converts the selected voltage by impedance conversion and outputs the converted voltage as the high-potential-side voltage VH.

Figure 16:
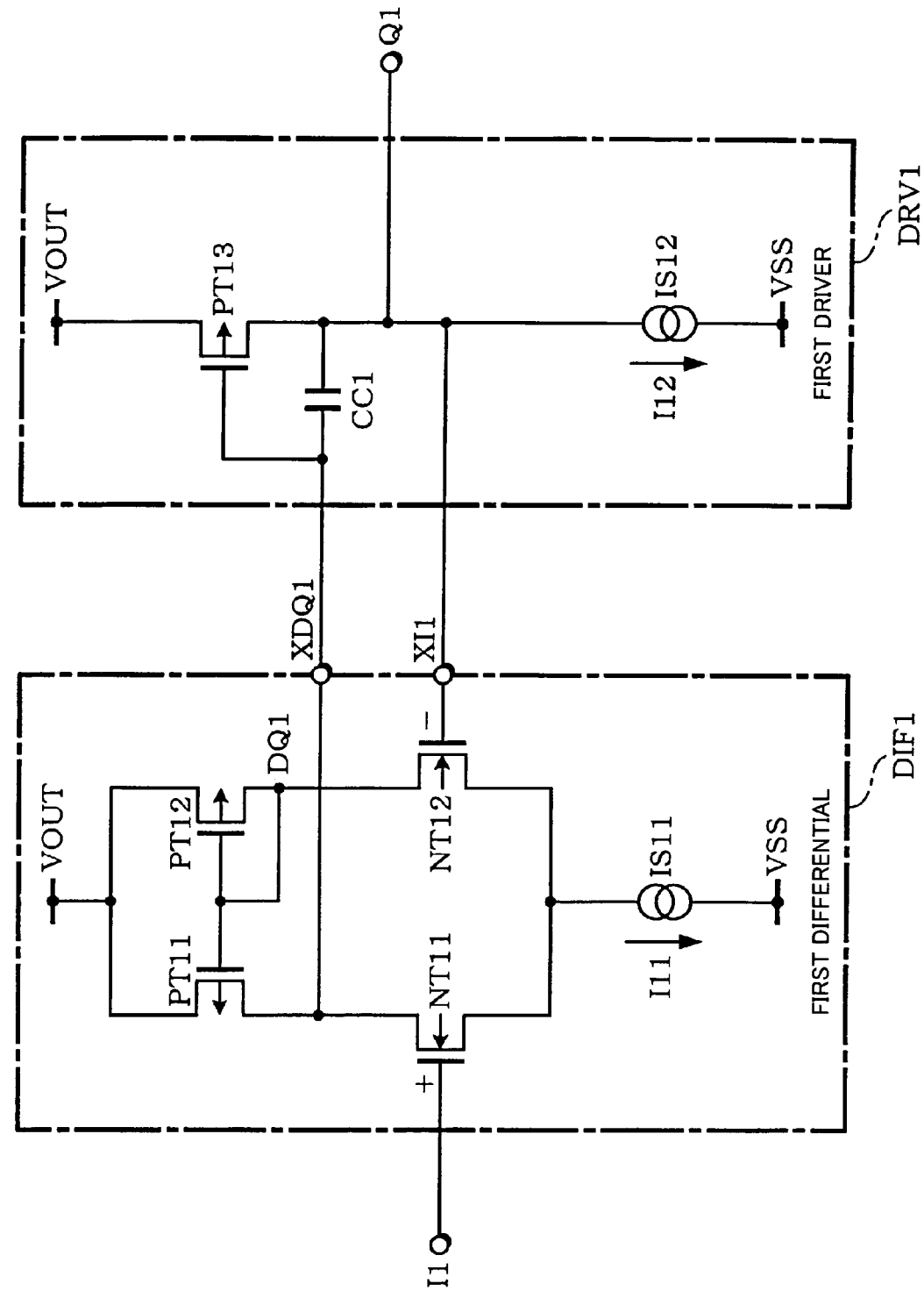
FIG. 16 is a circuit diagram showing the voltage-follower-connected operational amplifier shown in FIG. 15.

FIG. 16 is a circuit diagram showing the voltage-follower-connected operational amplifier OPH shown in FIG. 15.

The output of the operational amplifier OPH is driven by a p-channel driver transistor PT13. The operational amplifier OPH includes a first differential section DIF1 and a first driver section DRV1, and may be formed by voltage-follower-connecting the first differential section DIF1 and the first driver section DRV1.

The first driver section DRV1 includes the p-channel driver transistor PT13, but does not include an n-channel driver transistor. The first driver section DRV1 includes the p-channel driver transistor PT13 and a current source IS12. The p-channel driver transistor PT13 is connected with the power supply voltage VOUT at one end, and is connected with the output of the operational amplifier OPH at the other end. The current source IS12 is connected with the ground power supply voltage VSS at one end, and is connected with the output of the operational amplifier OPH at the other end. In FIG. 16, a capacitor CC1 is used for phase compensation.

The first differential section DIF1 includes p-channel transistors PT11 and PT12 of which gates are connected with an output DQ1 of the first differential section DIF1, n-channel transistors NT11 and NT12 of which gates are respectively connected with inputs I1 and XI1 of the first differential section DIF1, and a current source IS11 provided on the side of the ground power supply voltage VSS.

The operational amplifier OPH is voltage-follower-connected in which an output Q1 is connected with the input XI1 (inverting input) of the first differential section DIF1.

In the operational amplifier OPH having such a configuration, current flows through only paths I11 and I12. Therefore, the operational amplifier OPH can reduce the amount of unnecessary current in comparison with a class-AB operational amplifier circuit having three or more current paths, whereby power consumption can be reduced.

In the operational amplifier OPH, the amount of current I12 flowing through the current source IS12 can be significantly reduced when it is unnecessary to decrease the voltage level of the output Q1 toward the low potential side to a large extent. In the high-potential-side voltage supply circuit 120 shown in FIG. 12, the operational amplifier OPH need not decrease the voltage level of one end of the resistor circuit 112 toward the low potential side, but must increase the voltage level of one end of the resistor circuit 112 toward the high potential side. Therefore, power consumption can be reduced by configuring the operational amplifier OPH as shown in FIG. 16.

Figure 17:
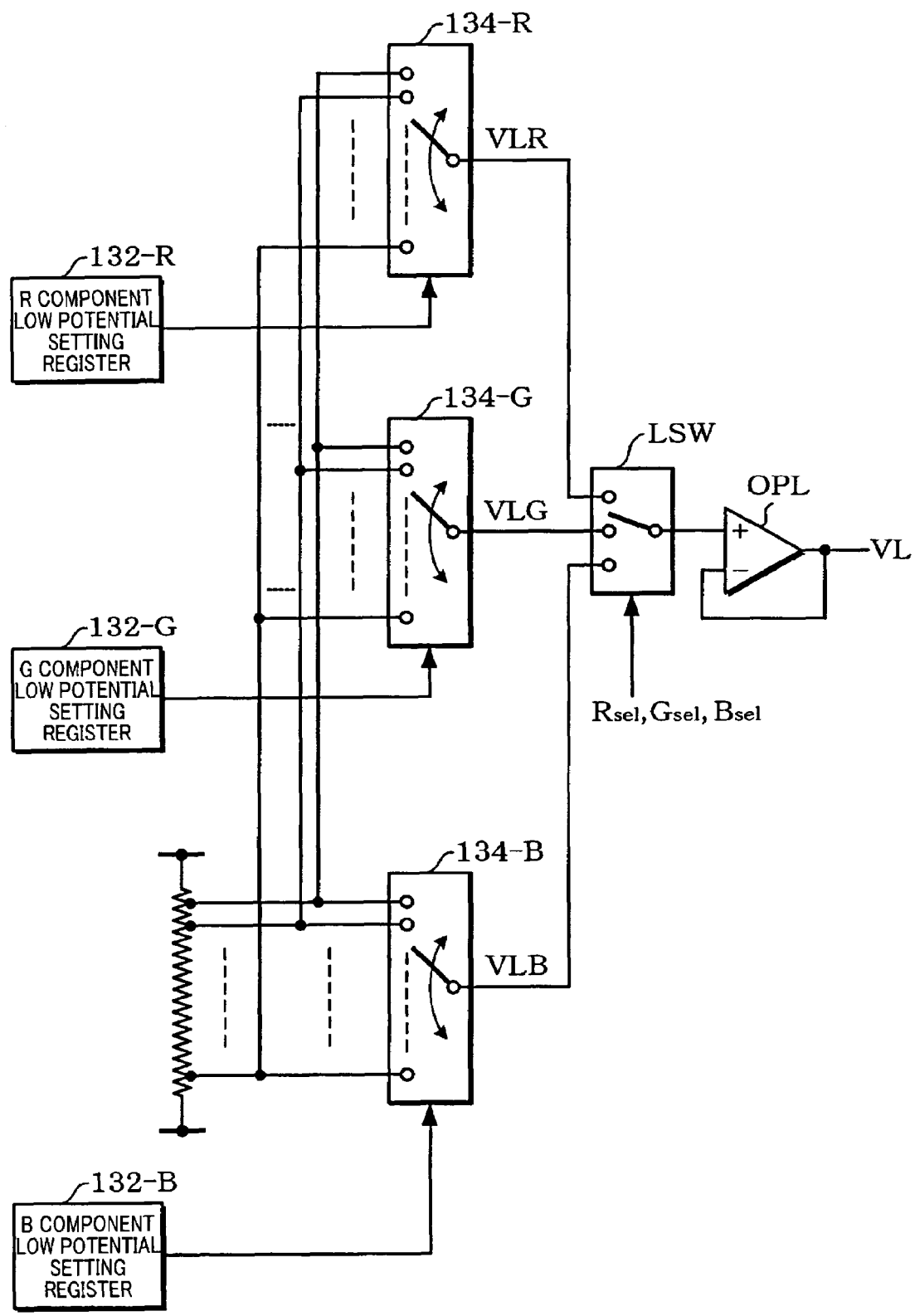
FIG. 17 is a block diagram showing the low-potential-side voltage supply circuit shown in FIG. 12.

FIG. 17 is a block diagram showing the low-potential-side voltage supply circuit 130 shown in FIG. 12.

The low-potential-side voltage supply circuit 130 outputs one of an R component low-potential-side voltage VLR, a G component low-potential-side voltage VLG, and a B component low-potential-side voltage VLB as the low-potential-side voltage VL. Therefore, the low-potential-side voltage supply circuit 130 includes a low-potential-side voltage supply switch LSW.

The low-potential-side voltage supply switch LSW outputs the R component low-potential-side voltage VLR as the low-potential-side voltage VL when the R component select signal Rse1 is active. The low-potential-side voltage supply switch LSW outputs the G component low-potential-side voltage VLG as the low-potential-side voltage VL when the G component select signal Gse1 is active. The low-potential-side voltage supply switch LSW outputs the B component low-potential-side voltage VLB as the low-potential-side voltage VL when the B component select signal Bse1 is active.

The R component low-potential-side voltage VLR is output as one of a plurality of reference low-potential-side voltages obtained by resistively dividing a given voltage based on a value set in an R component low potential setting register 132-R. The G component low-potential-side voltage VLG is output as one of a plurality of reference low-potential-side voltages obtained by resistively dividing a given voltage based on a value set in a G component low potential setting register 132-G. The B component low-potential-side voltage VLB is output as one of a plurality of reference low-potential-side voltages obtained by resistively dividing a given voltage based on a value set in a B component low potential setting register 132-B.

The values are set in the R component low potential setting register 132-R, the G component low potential setting register 132-G, and the B component low potential setting register 132-B by the display controller 50.

As described above, in the low-potential-side voltage supply circuit 130, one of the low-potential-side voltages generated in units of color components is selected by the low-potential-side voltage supply switch LSW. A voltage-follower-connected operational amplifier OPL converts the selected voltage by impedance conversion and outputs the converted voltage as the low-potential-side voltage VL.

Figure 18:
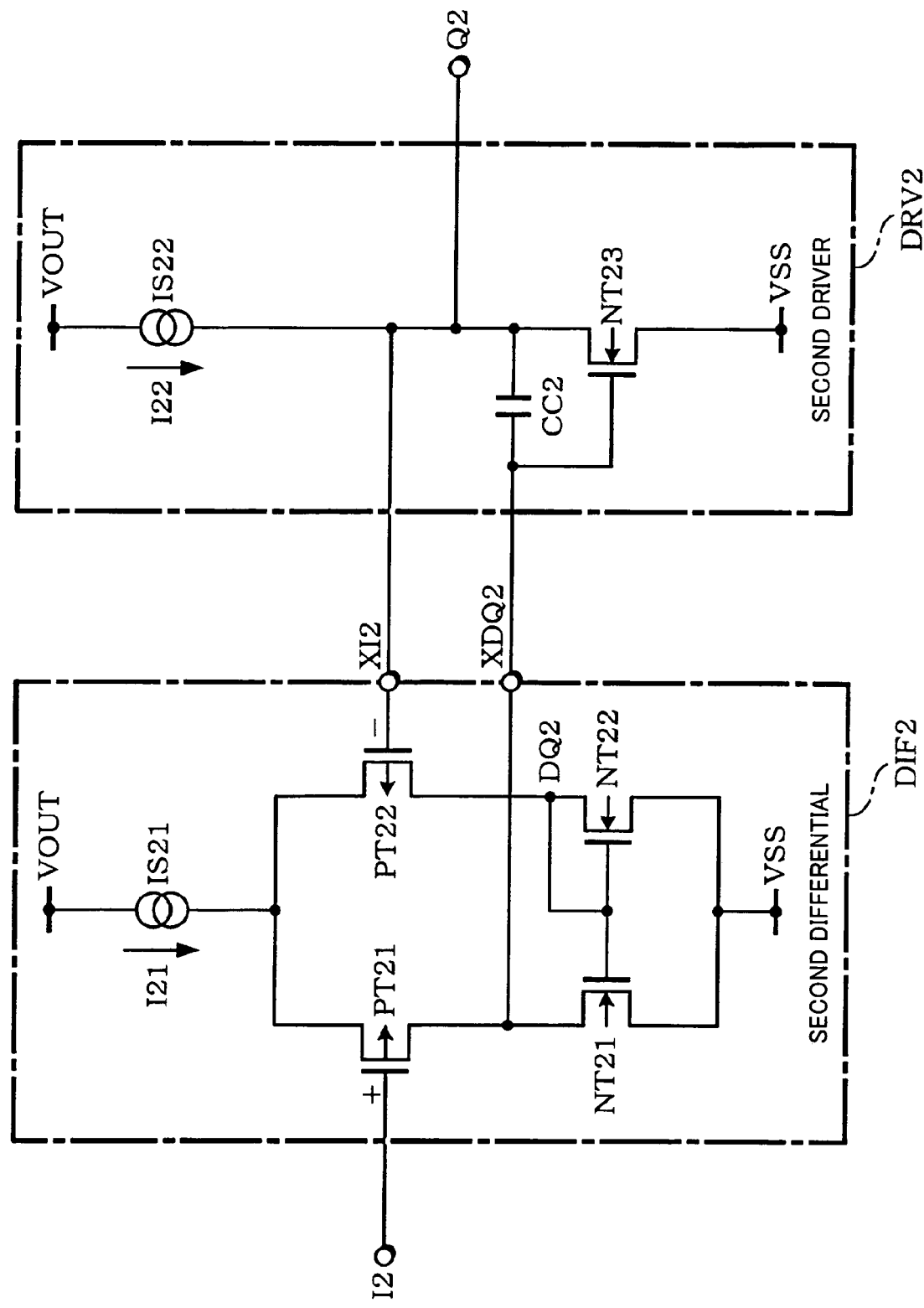
FIG. 18 is a circuit diagram showing the voltage-follower-connected operational amplifier shown in FIG. 17.

FIG. 18 is a circuit diagram showing the voltage-follower-connected operational amplifier OPL shown in FIG. 17.

The output of the operational amplifier OPL is driven by an n-channel driver transistor NT23. The operational amplifier OPL includes a second differential section DIF2 and a second driver section DRV2, and may be formed by voltage-follower-connecting the second differential section DIF2 and the second driver section DRV2.

The second driver section DRV2 includes the n-channel driver transistor NT23, but does not include a p-channel driver transistor. The second driver section DRV2 includes the n-channel driver transistor NT23 and a current source IS22. The n-channel driver transistor NT23 is connected with the ground power supply voltage VSS at one end, and is connected with the output of the operational amplifier OPL at the other end. The current source IS22 is connected with the power supply voltage VOUT at one end, and is connected with the output of the operational amplifier OPL at the other end. In FIG. 18, a capacitor CC2 is used for phase compensation.

The second differential section DIF2 includes n-channel transistors NT21 and NT22 of which gates are connected with an output DQ2 of the second differential section DIF2, p-channel transistors PT21 and PT22 of which gates are respectively connected with inputs I2 and XI2 of the second differential section DIF2, and a current source IS21 provided on the side of the power supply voltage VOUT.

The operational amplifier OPL is voltage-follower-connected in which an output Q2 is connected with the input XI2 (inverting input) of the second differential section DIF2.

In the operational amplifier OPL having such a configuration, current flows through only paths I21 and I22. Therefore, the operational amplifier OPL can reduce the amount of unnecessary current in comparison with a class-AB operational amplifier circuit having three or more current paths, whereby power consumption can be reduced.

In the operational amplifier OPL, the amount of current 122 flowing through the current source IS22 can be significantly reduced when it is unnecessary to increase the voltage level of the output Q2 toward the high potential side to a large extent. In the low-potential-side voltage supply circuit 130 shown in FIG. 12, the operational amplifier OPL need not increase the voltage level of the other end of the resistor circuit 112 toward the high potential side. Therefore, power consumption can be reduced by configuring the operational amplifier OPL as shown in FIG. 18.

In this embodiment, in the case where the high-potential-side voltage supply circuit 120 and the low-potential-side voltage supply circuit 130 respectively supply the high-potential-side voltage VH and the low-potential-side voltage VL according to the voltage-luminance characteristics shown in FIG. 11, it is preferable that the high-potential-side voltage VH and the low-potential-side voltage VL be as described below.

It is preferable that a difference $\Delta VR$ between the R component high-potential-side voltage VHR and the R component low-potential-side voltage VLR be greater than a difference $\Delta VG$ between the G component high-potential-side voltage VHG and the G component low-potential-side voltage VLG, and the difference $\Delta VG$ be greater than a difference $\Delta VB$ between the B component high-potential-side voltage VHB and the B component low-potential-side voltage VLB ($\Delta VR > \Delta VG > \Delta VB$). As shown in FIG. 11, since the B component has the highest emission start voltage and steeply rises in luminance, the B component has the narrowest voltage range when dividing a predetermined range of luminance by the number of grayscales. Moreover, since the R component has a wider voltage range up to the point where a predetermined luminance is reached after the start of light emission than the G component, the difference $\Delta VR$ is set to be greater than the difference $\Delta VG$.

In regard to the resistance between the resistive division nodes of the gamma correction resistor circuit 110 for each color component, the resistance between the resistive division nodes for the B component is the smallest for the same reason as described above.

It is preferable that the B component high-potential-side voltage VHB be the lowest among the R component high-potential-side voltage VHR, the G component high-potential-side voltage VHG, and the B component high-potential-side voltage VHB (VHR and VHG>VHB). This is because it is preferable to divide the luminance by a plurality of grayscale levels in a wider voltage range, since the B component has the highest emission start voltage as shown in FIG. 11.

Figure 19:
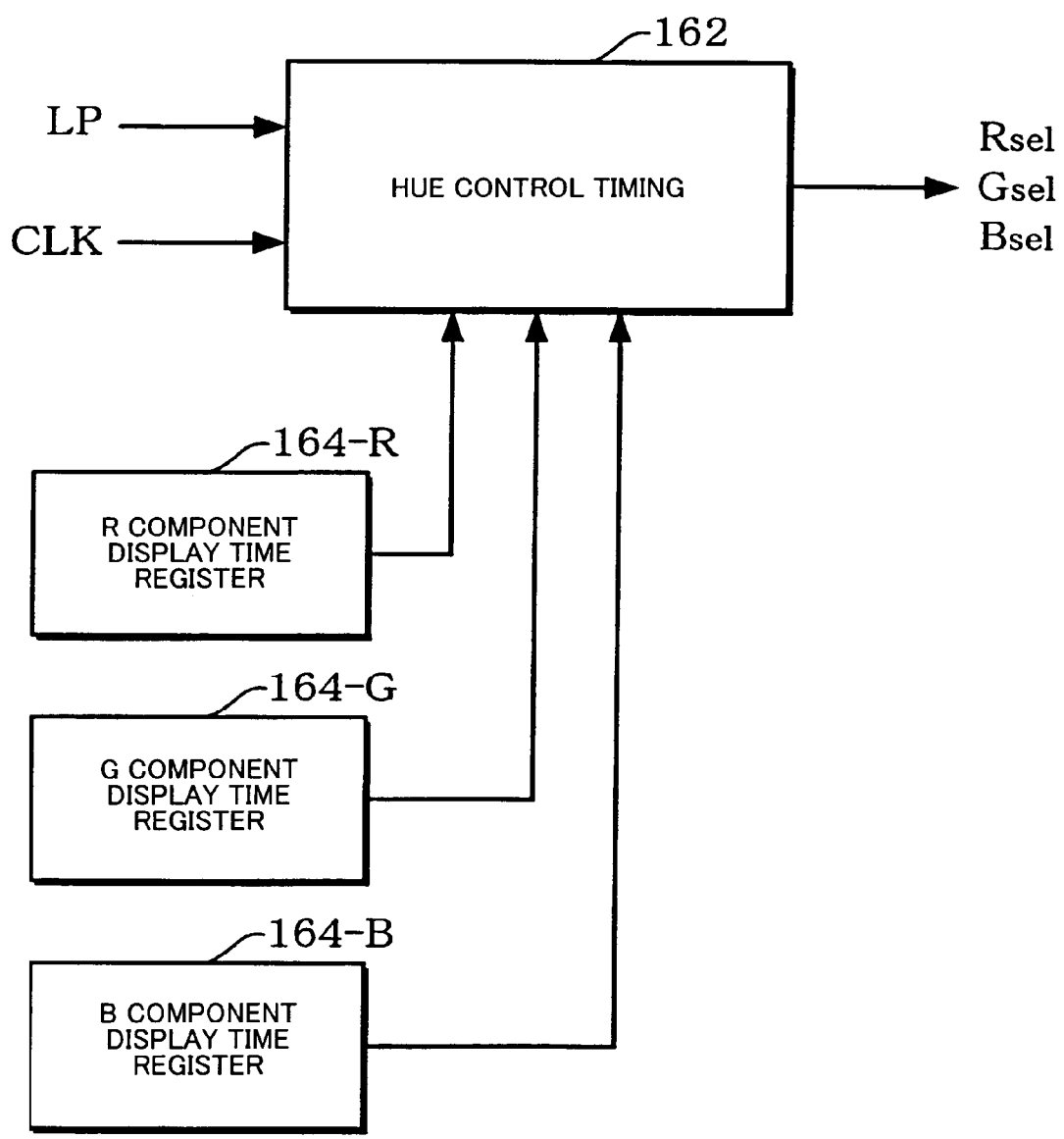
FIG. 19 is a block diagram showing the gamma correction control circuit shown in FIG. 12.

FIG. 19 is a block diagram showing the gamma correction control circuit 160 shown in FIG. 12.

The gamma correction control circuit 160 includes a hue control timing circuit 162. The hue control timing circuit 162 generates the R component select signal Rse1, the G component select signal Gse1, and the B component select signal Bse1 which specify the time division timing of each color component. The hue control timing circuit 162 can generate the R component select signal Rse1, the G component select signal Gse1, and the B component select signal Bse1 based on the horizontal synchronization signal LP and the clock signal (dot clock signal) CLK.

In more detail, the hue control timing circuit 162 generates the R component select signal Rse1 based on a value set in an R component display time register 164-R. The hue control timing circuit 162 generates the G component select signal Gse1 based on a value set in a G component display time register 164-G. The hue control timing circuit 162 generates the B component select signal Bse1 based on a value set in a B component display time register 164-B.

Figure 20:
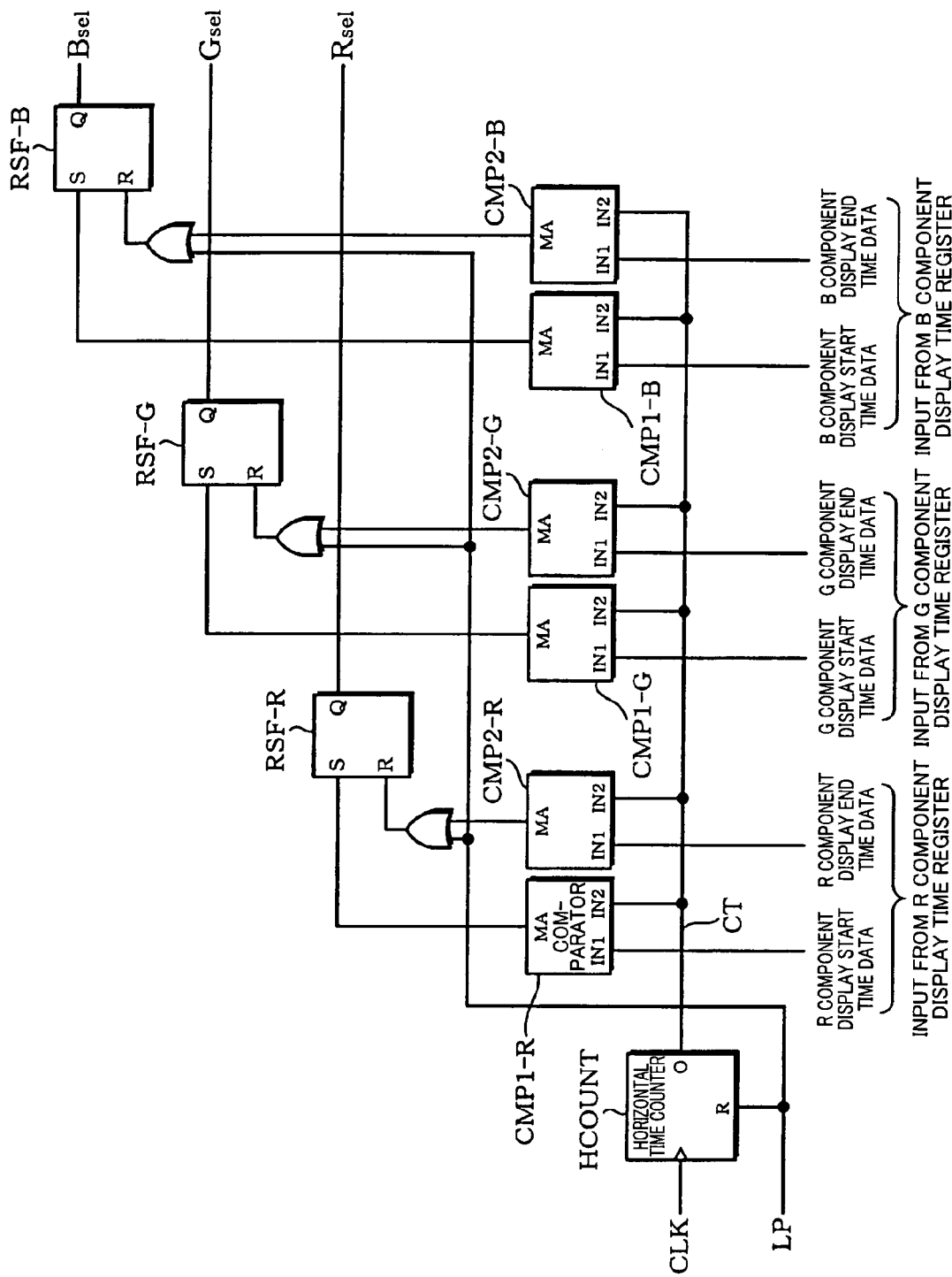
FIG. 20 is a circuit diagram showing the hue control timing circuit shown in FIG. 19.

FIG. 20 is a circuit diagram showing the hue control timing circuit 162 shown in FIG. 19.

R component display start time data and R component display end time data set in the R component display time register 164-R are input to the hue control timing circuit 162. G component display start time data and G component display end time data set in the G component display time register 164-G and B component display start time data and B component display end time data set in the B component display time register 164-B are input to the hue control timing circuit 162.

In the hue control timing circuit 162, a horizontal time counter HCOUNT increments a count value CT in synchronization with the rising edge of the clock signal CLK, and supplies the count value CT to comparators CMP1-R, CMP2-R, CMP1-G, CMP2-G, CMP1-B, and CMP2-B.

The comparator CMP1-R compares the count value CT with the R component display start time data, and sets its output at the H level when these values coincide. The comparator CMP2-R compares the count value CT with the R component display end time data, and sets its output at the H level when these values coincide. The remaining comparators are the same as described above.

A reset-set flip-flop RSF-R sets its output (sets its output at the H level) when the output from the comparator CMP1-R is set at the H level, and resets its output (sets its output at the L level) when the output from the comparator CMP2-R is set at the H level. The output from the reset-set flip-flop RSF-R is the R component select signal Rse1. The reset-set flip-flop RSF-R is also reset when the horizontal synchronization signal LP is set at the H level.

Reset-set flip-flops RSF-G and RSF-B respectively output the G component select signal Gse1 and the B component select signal Bse1 in the same manner as the reset-set flip-flop RSF-R.

Figure 21:
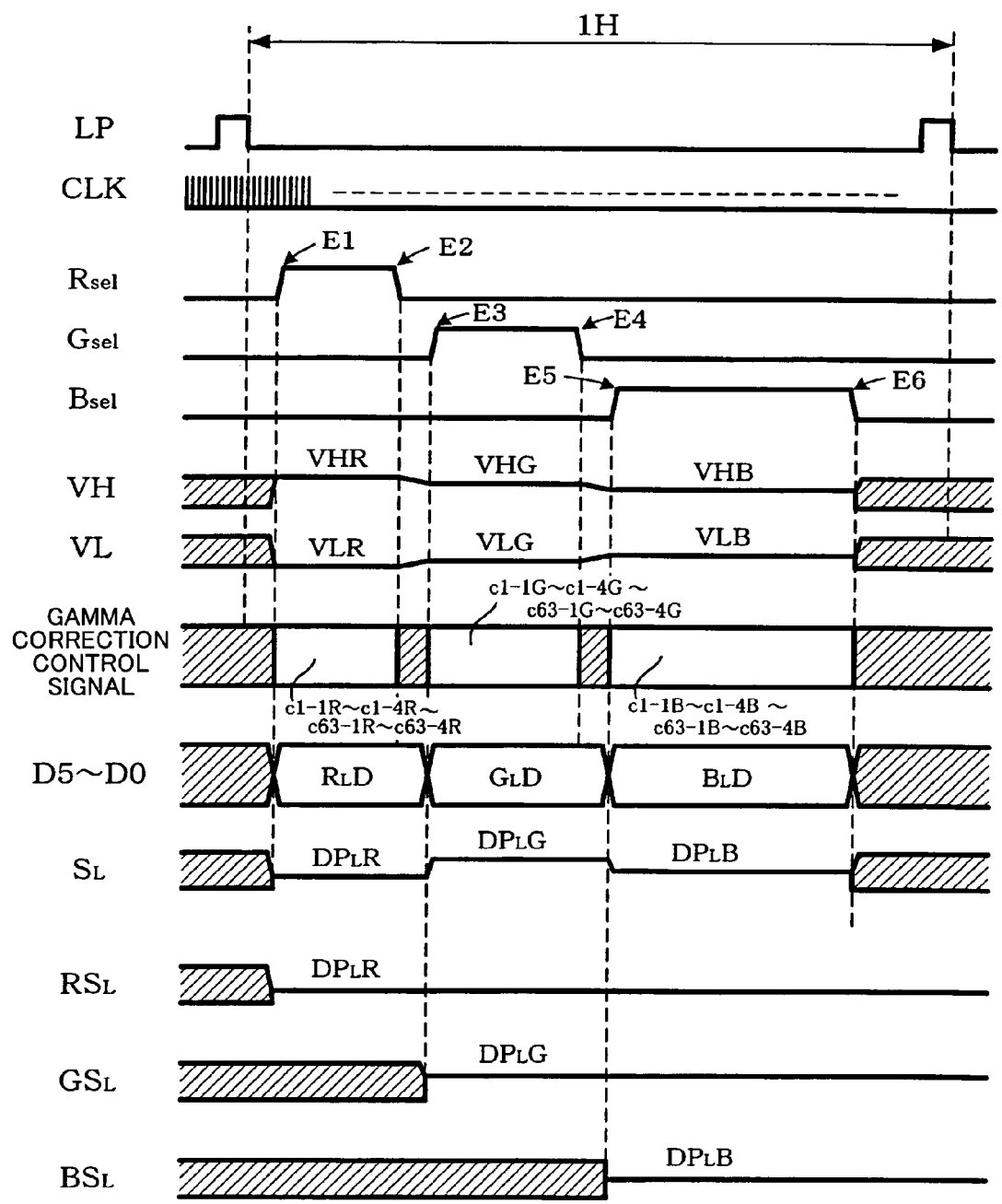
FIG. 21 is a timing chart showing an operation example of the reference voltage generation circuit in an embodiment of the present invention and a data line driver circuit including the reference voltage generation circuit.

FIG. 21 is a timing chart showing an operation example of the reference voltage generation circuit in this embodiment and a data line driver circuit including the reference voltage generation circuit.

The horizontal synchronization signal LP and the clock signal CLK are input to the hue control timing circuit 162 of the gamma correction control circuit 160. When the count value incremented based on the clock signal CLK coincides with the R component display start time data (E1), the R component select signal Rse1 is set at the H level. When the count value coincides with the R component display end time data (E2), the R component select signal Rse1 is set at the L level.

A period in which the R component select signal Rse1 is set at the H level is the R component select period. In the R component select period, the high-potential-side voltage supply circuit 120 supplies the R component high-potential-side voltage VHR to one end of the resistor circuit 112 as the high-potential-side voltage VH, and the low-potential-side voltage supply circuit 130 supplies the R component low-potential-side voltage VLR to the other end of the resistor circuit 112 as the low-potential-side voltage VL.

In the R component select period, the selector 140 outputs the R component correction switch control signals c1-1R to c1-4R, . . . , c62-1R to c62-4R, and c63-1R to c63-4R as the correction switch control signals c1-1 to c1-4, . . . , c62-1 to c62-4, and c63-1 to c63-4. Therefore, in the resistor circuit 112 of the gamma correction resistor circuit 110, the resistance between the resistive division nodes is corrected for the R component. Therefore, the reference voltages V0R to V63R gamma-corrected for the R component are output to the reference voltage select ROM circuits as the reference voltages V0 to V63 through the reference voltage signal lines.

For example, the reference voltage select ROM circuit $VSEL_L$ among the reference voltage select ROM circuits $VSEL_1$ to $VSEL_N$ selects one of the reference voltages V0 to V63 as the data voltage $DP_LR$ based on the R component grayscale data $R_LD$. The operational amplifier circuit $OPC_L$ drives the data line $S_L$ of the display panel 20 based on the data voltage $DP_LR$. The same description also applies to the reference voltage select ROM circuits and the operational amplifier circuits provided corresponding to other data lines.

The R component select signal Rse1, the G component select signal Gse1, and the B component select signal Bse1 generated by the data line driver circuit 40 as described above are supplied to the display panel 20, for example. The demultiplexer $DMUX_L$ of the display panel 20 electrically connects the data line SL with the R component data line $RS_L$ based on the R component select signal Rse1, whereby the data voltage $DP_LR$ of the operational amplifier circuit $OPC_L$ is supplied to the R component data line $RS_L$.

When the count value incremented based on the clock signal CLK coincides with the G component display start time data (E3), the G component select signal Gse1 is set at the H level. When the count value coincides with the G component display end time data (E4), the G component select signal Gse1 is set at the L level.

A period in which the G component select signal Gse1 is set at the H level is the G component select period. In the G component select period, the high-potential-side voltage supply circuit 120 supplies the G component high-potential-side voltage VHG to one end of the resistor circuit 112 as the high-potential-side voltage VH, and the low-potential-side voltage supply circuit 130 supplies the G component low-potential-side voltage VLG to the other end of the resistor circuit 112 as the low-potential-side voltage VL.

In the G component select period, the selector 140 outputs the G component correction switch control signals c1-1G to c1-4G, . . . , c62-1G to c62-4G, and c63-1G to c63-4G as the correction switch control signals c1-1 to c1-4, . . . , c62-1 to c62-4, and c63-1 to c63-4. Therefore, in the resistor circuit 112 of the gamma correction resistor circuit 110, the resistance between the resistive division nodes is corrected for the G component. Therefore, the reference voltages V0G to V63G gamma-corrected for the G component are output to the reference voltage select ROM circuits as the reference voltages V0 to V63 through the reference voltage signal lines.

For example, the reference voltage select ROM circuit $VSEL_L$ among the reference voltage select ROM circuits $VSEL_1$ to $VSEL_N$ selects one of the reference voltages V0 to V63 as the data voltage $DP_LG$ based on the G component grayscale data $G_LD$, and the operational amplifier circuit $OPC_L$ drives the data line SL of the display panel 20 based on the data voltage $DP_LG$. The demultiplexer $DMUX_L$ of the display panel 20 electrically connects the data line SL with the G component data line $GS_L$ based on the G component select signal Gse1, whereby the data voltage $DP_LG$ of the operational amplifier circuit $OPC_L$ is supplied to the G component data line $GS_L$. The same description also applies to the reference voltage select ROM circuits and the operational amplifier circuits provided corresponding to other data lines.

When the count value incremented based on the clock signal CLK coincides with the B component display start time data (E5), the B component select signal Bse1 is set at the H level. When the count value coincides with the B component display end time data (E6), the B component select signal Bse1 is set at the L level.

A period in which the B component select signal Bse1 is set at the H level is the B component select period. In the B component select period, the high-potential-side voltage supply circuit 120 supplies the B component high-potential-side voltage VHB to one end of the resistor circuit 112 as the high-potential-side voltage VH, and the low-potential-side voltage supply circuit 130 supplies the B component low-potential-side voltage VLB to the other end of the resistor circuit 112 as the low-potential-side voltage VL.

In the B component select period, the selector 140 outputs the B component correction switch control signals c1-1B to c1-4B, . . . , c62-1B to c62-4B, and c63-1B to c63-4B as the correction switch control signals c1-1 to c1-4, . . . , c62-1 to c62-4, and c63-1 to c63-4. Therefore, in the resistor circuit 112 of the gamma correction resistor circuit 110, the resistance between the resistive division nodes is corrected for the B component. Therefore, the reference voltages V0B to V63B gamma-corrected for the B component are output to the reference voltage select ROM circuits as the reference voltages V0 to V63 through the reference voltage signal lines.

For example, the reference voltage select ROM circuit $VSEL_L$ among the reference voltage select ROM circuits $VSEL_1$ to $VSEL_N$ selects one of the reference voltages V0 to V63 as the data voltage $DP_LB$ based on the B component grayscale data $B_LD$, and the operational amplifier circuit $OPC_L$ drives the data line SL of the display panel 20 based on the data voltage $DP_LB$. The demultiplexer $DMUX_L$ of the display panel 20 electrically connects the data line $S_L$ with the B component data line $BS_L$ based on the B component select signal Bse1, whereby the data voltage $DP_LB$ of the operational amplifier circuit $OPC_L$ is supplied to the B component data line $BS_L$. The same description also applies to the reference voltage select ROM circuits and the operational amplifier circuits provided corresponding to other data lines.

3. Electronic Instrument

A display device in an embodiment of the present invention is provided as a display section of an electronic instrument. In more detail, the display device may be incorporated into various electronic instruments such as a portable telephone, a portable information instrument (such as PDA), a digital camera, a projector, a portable audio player, a mass storage device, a video camera, an electronic notebook, and a global positioning system (GPS).

Figure 22:
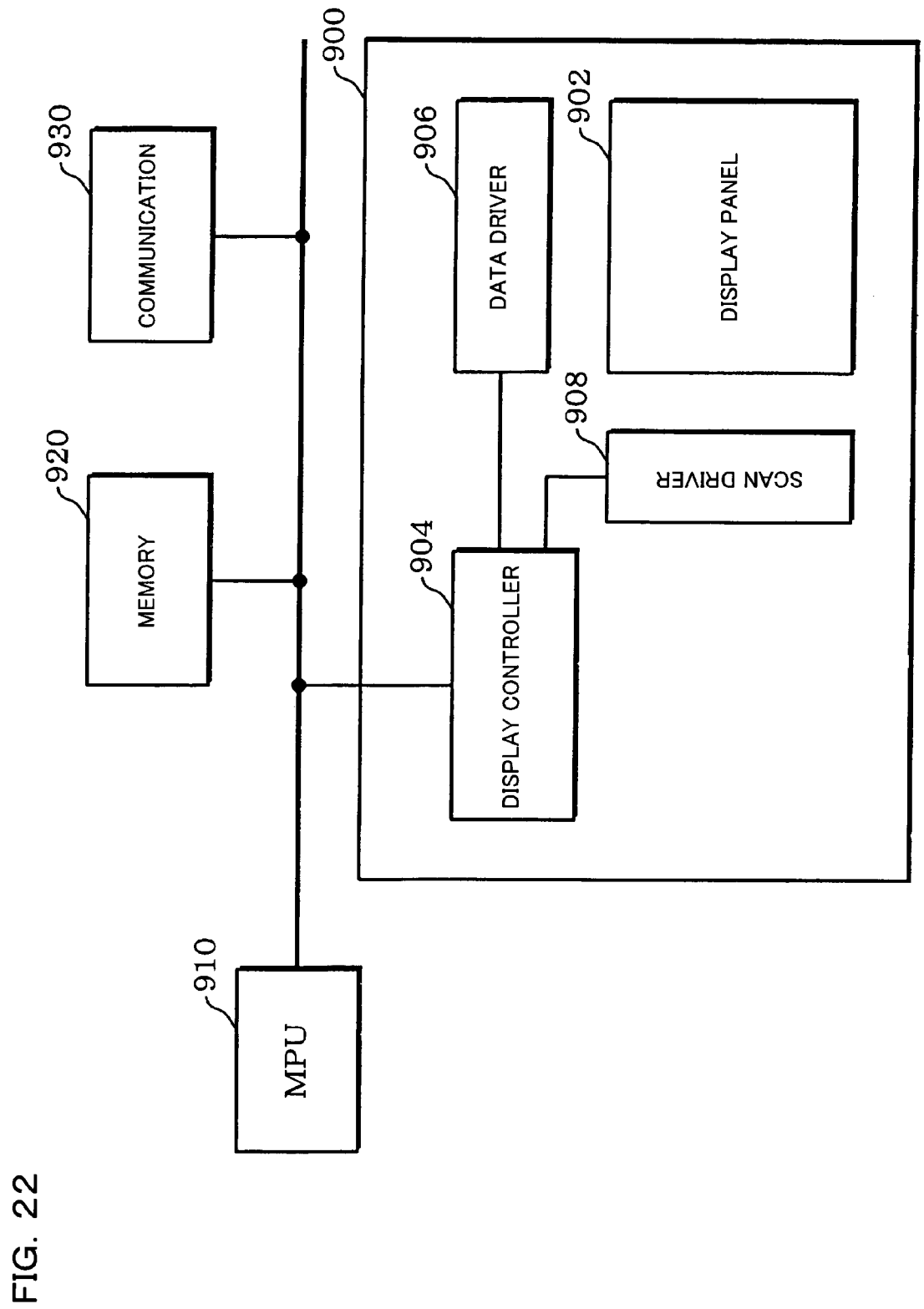
FIG. 22 is a block diagram showing an example of an electronic instrument to which the display device in an embodiment of the present invention is applied.

FIG. 22 is a block diagram showing an example of an electronic instrument to which the display device in an embodiment of the present invention is applied. FIG. 22 shows a portable telephone as an example.

A display device 900 in this embodiment is connected with an MPU 910 through a bus. A memory 920 and a communication section 930 are also connected to the bus.

The MPU 910 controls each section through the bus. The memory 920 includes a storage region corresponding to each pixel of a display panel 902 of the display device 900, and image data randomly written by the MPU 910 is sequentially read along a scan direction.

The communication section 930 performs various types of control for communicating with the outside (host device or another electronic instrument, for example). The function of the communication section 930 may be realized by hardware such as various processors or a communication ASIC, a program, and the like.

In this electronic instrument, the MPU 910 sets an operation mode (information for determining the size of a display image, a horizontal scanning cycle, and a vertical scanning cycle, or the like) of a data driver 906 and a scan driver 908 in a display controller 904, for example. The display controller 904 generates various timing signals necessary for driving the display panel 902 and supplies the generated timing signals to the data driver 906. The data driver 906 has the same configuration as the configuration of the data line driver circuit 40 in this embodiment. The scan driver 908 has the same configuration as the configuration of the scan line driver circuit 30 in this embodiment, and scans scan lines of the display panel 902 based on the display control from the display controller 904.

Figure 23:
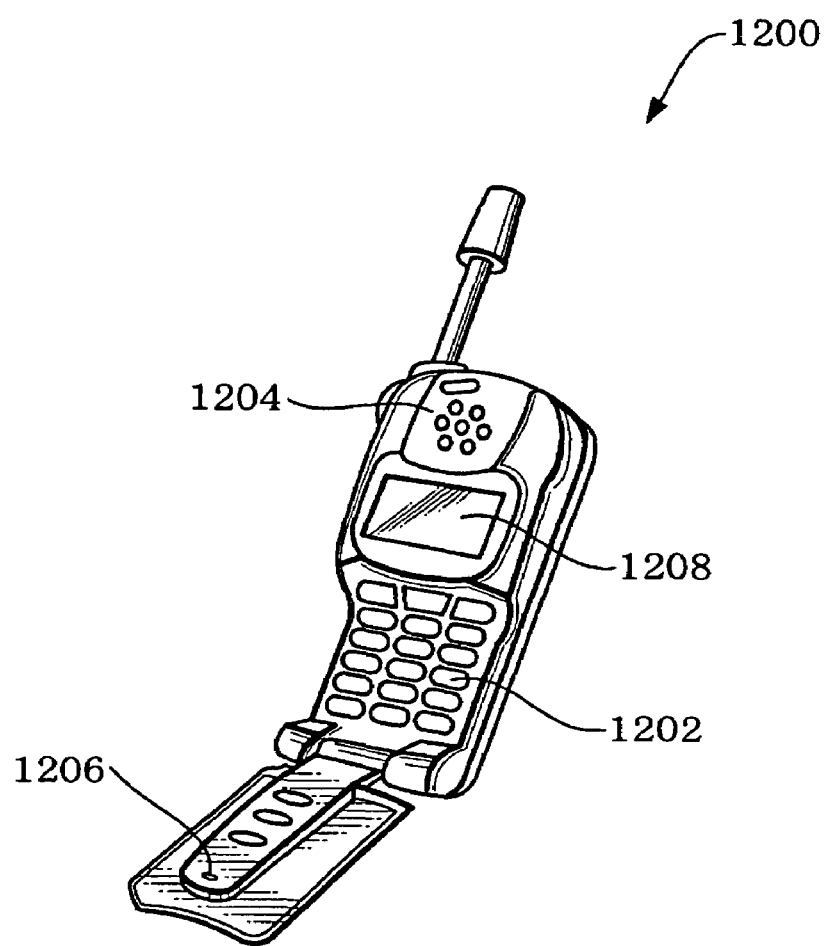
FIG. 23 is a perspective diagram showing a portable telephone as an example of an electronic instrument to which the display device in an embodiment of the present invention is applied.

FIG. 23 is a perspective diagram showing a portable telephone as an example of an electronic instrument to which the display device in this embodiment is applied.

A portable telephone 1200 includes a plurality of operation buttons 1202, a receiver 1204, a microphone 1206, and a panel 1208. As the panel 1208, a display panel which forms the display device in this embodiment is applied. The panel 1208 displays a radio field intensity, numbers, and characters during waiting, and sets the entire area as a display region during reception and transmission. In this case, power consumption can be reduced by controlling the display region.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

For example, the present invention may be applied not only to drive the above-described organic EL panel, but also to drive another electroluminescent panel, a liquid crystal device, or a plasma display device.

This embodiment illustrates the case where one pixel is made up of three dots and includes the R component, the G component, and the B component. However, the present invention is not limited thereto. The same description also applies to the case where one pixel is made up of two color components or one pixel is made up of four or more color components.

In this embodiment, the function of the demultiplexers $DMUX_1$ to $DMUX_N$ of the display panel may be provided to the data line driver circuit 40.

Part of requirements of any claim of the present invention could be omitted from a dependent claim which depends on that claim. Moreover, part of requirements of any independent claim of the present invention could be made to depend on any other independent claim.

What is claimed is:

1. A reference voltage generation circuit for generating a plurality of reference voltages including a reference voltage selected corresponding to grayscale data, the reference voltage generation circuit comprising:

a gamma correction resistor circuit which includes a resistor circuit and outputs the reference voltages generated by resistively dividing voltages of two opposite ends of the resistor circuit to a plurality of resistive division nodes; and first and second voltage supply circuits which supply a high-potential-side voltage and a low-potential-side voltage to the two opposite ends of the resistor circuit, respectively, wherein the first and second voltage supply circuits supply at least one of the high-potential-side voltage and the low-potential-side voltage to the two opposite ends of the resistor circuit, respectively, by switching the high-potential-side voltage and the low-potential-side voltage for each of color components which form one pixel, the high-potential-side voltage and the low-potential-side voltage being provided for each of the color components, and wherein the gamma correction resistor circuit supplies each of the reference voltages to one of a plurality of reference voltage signal lines to be selected as inputs of first and second driver sections, the reference voltages being switched for each of the color components, and the first and second driver sections respectively driving first and second data lines of an electro-optical device.

2. The reference voltage generation circuit as defined in claim 1, wherein the gamma correction resistor circuit includes a correction switch circuit inserted between two of the resistance division nodes, and wherein the correction switch circuit includes a resistor element and a switch element, and electrically connects or disconnects the two resistance division nodes into which the correction switch circuit is inserted, the resistor element and the switch element being connected in series.

3. The reference voltage generation circuit as defined in claim 1, wherein the gamma correction resistor circuit causes at least one of the reference voltages to differ for each of the color components.

4. The reference voltage generation circuit as defined in claim 1, wherein the color components which form one pixel include an R component, a G component, and a B component, and wherein a difference between the high-potential-side voltage and the low-potential-side voltage for the R component is greater than a difference between the high-potential-side voltage and the low-potential-side voltage for the G component, and the difference between the high-potential-side voltage and the low-potential-side voltage for the G component is greater than a difference between the high-potential-side voltage and the low-potential-side voltage for the B component.

5. The reference voltage generation circuit as defined in claim 1, wherein the color components which form one pixel include an R component, a G component, and a B component, and wherein the high-potential-side voltage for the B component is the lowest among the high-potential-side voltage for the R component, the high-potential-side voltage for the G component, and the high-potential-side voltage for the B component.

6. The reference voltage generation circuit as defined in claim 1, wherein the first voltage supply circuit includes a voltage-follower-connected operational amplifier, and wherein an output of the operational amplifier is driven by a p-channel driver transistor.

7. The reference voltage generation circuit as defined in claim 1,
wherein the second voltage supply circuit includes a voltage-follower-connected operational amplifier, and
wherein an output of the operational amplifier is driven by a n-channel driver transistor.

8. The reference voltage generation circuit as defined in claim 1,
wherein the grayscale data is multiplexed by time division for each of the color components which form one pixel, and
wherein the first and second voltage supply circuits supply at least one of the high-potential-side voltage and the low-potential-side voltage to the two opposite ends of the resistor circuit, respectively, by switching the high-potential-side voltage and the low-potential-side voltage for each of the color components at a time division timing of each of the color components of the grayscale data.

9. A data driver for driving a plurality of data lines of an electro-optical device including a plurality of scan lines and the data lines based on grayscale data, the data driver comprising:
the reference voltage generation circuit as defined in claim 8;
a multiplexer circuit which multiplexes the grayscale data for each of the color components of one pixel by time division;
a data voltage generation circuit which outputs reference voltages among the plurality of reference voltages corresponding to first and second grayscale data as first and second data voltages, the first and second grayscale data being multiplexed by the multiplexer circuit;
a first driver section which drives the first data line based on the first data voltage; and
a second driver section which drives the second data line based on the second data voltage.

10. A display device, comprising:
a plurality of scan lines;
a plurality of data lines;
a plurality of pixels specified by the scan lines and the data lines;
a scan driver which scans the scan lines; and
the data driver as defined in claim 9 which drives the data lines of the display device.

11. The display device as defined in claim 10, wherein each of the pixels includes an electroluminescent element.

12. An electronic instrument, comprising the display device as defined in claim 10.

13. A display device, comprising:
a plurality of scan lines;
a plurality of data lines;
a plurality of color component data lines provided for each of color components which form one pixel;
a plurality of pixels specified by the scan lines and the color component data lines;
a scan driver which scans the scan lines;
the data driver as defined in claim 9 which drives the data lines of the display device; and
a plurality of demultiplexers, each of the demultiplexers being provided for one of the data lines and electrically connecting the one of the data lines with corresponding one of the color component data lines in synchronization with a time division timing of the grayscale data.

14. The display device as defined in claim 13, wherein each of the pixels includes an electroluminescent element.

15. An electronic instrument, comprising the display device as defined in claim 13.

16. A data driver for driving a plurality of data lines of an electro-optical device including a plurality of scan lines and the data lines based on grayscale data, the data driver comprising:
the reference voltage generation circuit as defined in claim 1;
a data voltage generation circuit which outputs reference voltages among the plurality of reference voltages corresponding to first and second grayscale data as first and second data voltages;
a first driver section which drives the first data line based on the first data voltage; and
a second driver section which drives the second data line based on the second data voltage.

17. A display device, comprising:
a plurality of scan lines;
a plurality of data lines;
a plurality of pixels specified by the scan lines and the data lines;
a scan driver which scans the scan lines; and
the data driver as defined in claim 16 which drives the data lines of the display device.

18. The display device as defined in claim 17, wherein each of the pixels 25 includes an electroluminescent element.

19. An electronic instrument, comprising the display device as defined in claim 17.

* * * * *